(12) United States Patent
Koga et al.

(10) Patent No.: US 8,587,389 B2
(45) Date of Patent: Nov. 19, 2013

(54) ELECTRONIC DEVICE

(75) Inventors: Wataru Koga, Kyoto (JP); Yuuko Yokota, Kyoto (JP); Motoki Itou, Kyoto (JP); Yoshifumi Yamagata, Kyoto (JP)

(73) Assignee: Kyocera Corporation, Kyoto (JP)

( * ) Notice: Subject to any disclaimer, the term of this patent is extended or adjusted under 35 U.S.C. 154(b) by 618 days.

(21) Appl. No.: 12/675,110

(22) PCT Filed: Aug. 29, 2008

(86) PCT No.: PCT/JP2008/065580
§ 371 (c)(1),
(2), (4) Date: Jan. 11, 2011

(87) PCT Pub. No.: WO2009/028683
PCT Pub. Date: Mar. 5, 2009

(65) Prior Publication Data
US 2011/0109400 A1    May 12, 2011

(30) Foreign Application Priority Data
Aug. 30, 2007  (JP) .................................. 2007-224057

(51) Int. Cl.
*H03H 9/00*    (2006.01)
*H01L 41/00*    (2013.01)
(52) U.S. Cl.
USPC .......................................... 333/133; 333/193
(58) Field of Classification Search
USPC ........................... 333/133, 193, 194, 195, 196
See application file for complete search history.

(56) References Cited

U.S. PATENT DOCUMENTS

| | | | |
|---|---|---|---|
| 7,053,731 B2 | 5/2006 | Iwamoto et al. | |
| 7,298,231 B2 | 11/2007 | Ikuta et al. | |
| 7,304,377 B2 * | 12/2007 | Nakano | 257/700 |
| 7,583,161 B2 | 9/2009 | Tanaka | 333/133 |
| 8,405,472 B2 * | 3/2013 | Kitamura | 333/133 |
| 2004/0155730 A1 | 8/2004 | Iwamoto et al. | 333/193 |

(Continued)

FOREIGN PATENT DOCUMENTS

| | | |
|---|---|---|
| CN | 1543065 A | 11/2004 |
| CN | 1702961 A | 11/2005 |

(Continued)

OTHER PUBLICATIONS

Japanese language office action dated May 8, 2012 and its English language translation issued in corresponding Japanese application 2009530215.

(Continued)

*Primary Examiner* — Dean O Takaoka
(74) *Attorney, Agent, or Firm* — DLA Piper LLP (US)

(57) ABSTRACT

The branching filter has the piezoelectric substrate having the main surface on which there are formed a transmission filter, which includes an input electrode and an antenna electrode, and a reception filter, which includes an output electrodes and the antenna electrode. The branching filter also has the mounting substrate having, on a first main surface, a first electrode group that is connected to the transmission filter and reception filter and that is formed symmetrical with respect to a line when viewed from the above, and also having, on a second main surface locating on the opposite side to the first main surface, a second electrode group that is connected to the circuit interconnects of an external circuit board and that is formed symmetrical with respect to a line when viewed from the above.

20 Claims, 16 Drawing Sheets

(56) References Cited

U.S. PATENT DOCUMENTS

| | | | |
|---|---|---|---|
| 2005/0264375 A1 | 12/2005 | Ikuta et al. | 333/133 |
| 2007/0046394 A1 | 3/2007 | Inoue et al. | 333/133 |
| 2008/0048315 A1 | 2/2008 | Nagano et al. | 257/723 |

FOREIGN PATENT DOCUMENTS

| | | |
|---|---|---|
| CN | 1898864 A | 1/2007 |
| EP | 1 976 118 A1 | 10/2008 |
| JP | 09-098046 | 4/1997 |
| JP | 2003-249842 | 9/2003 |
| JP | 2005-277522 | 10/2005 |
| JP | 2006-014296 | 1/2006 |
| JP | 2007-060412 | 3/2007 |
| WO | WO 2006/038421 A1 | 4/2006 |
| WO | 2007083432 A1 | 7/2007 |
| WO | WO 2007/083432 A1 | 7/2007 |

OTHER PUBLICATIONS

Chinese language office action dated Feb. 13, 2012 and its English language translation issued in corresponding Chinese application 200880024565.6 cites the foreign patent documents above.

* cited by examiner

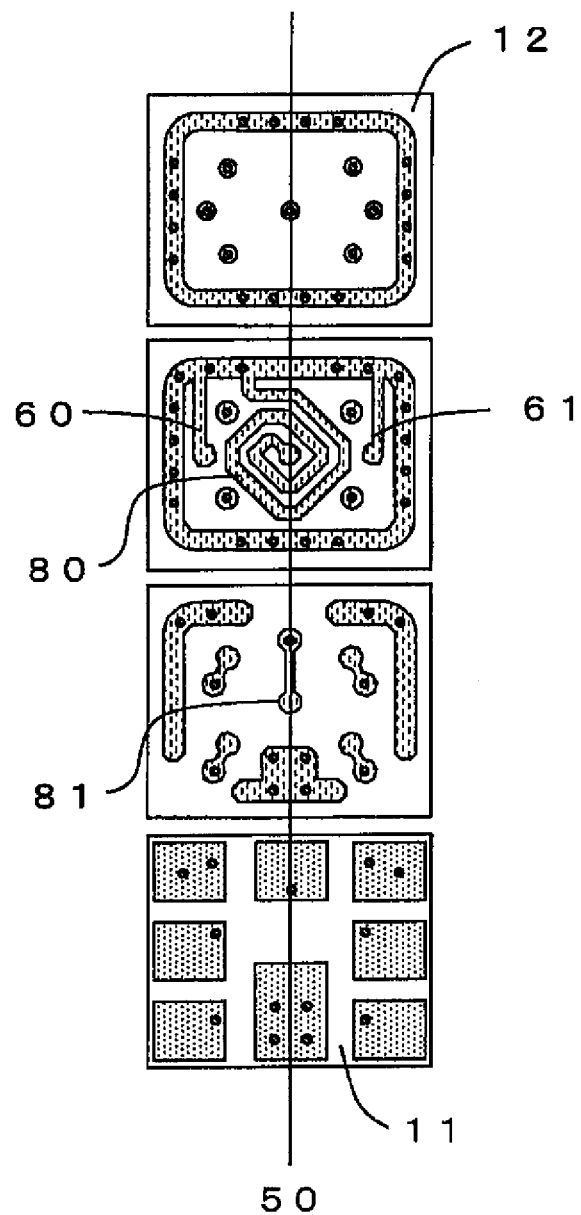

ELECTRONIC DEVICE

CROSS-REFERENCE TO THE RELATED APPLICATIONS

This application is a national stage of international application No. PCT/JP2008/065580, filed on Aug. 29, 2008, and claims the benefit of priority under 35 USC 119 to Japanese Patent Application No. 2007-224057, filed on Aug. 30, 2007, the entire contents of which are incorporated herein by reference.

TECHNICAL FIELD

The present invention relates to a branching filter or other electronic devices. More, specifically, it relates to an electronic device in which the same members can be used even when terminals of an external circuit board are arranged inversely between the left and right.

BACKGROUND ART

In recent years, in mobile communication terminals, a branching filter has been used as an electronic device using an elastic wave filter utilizing a surface acoustic wave resonator or thin film bulk wave resonator. A branching filter is an element which is connected between an antenna and a transmission/reception circuit in a mobile communication terminal and is used for transferring a reception signal received at the antenna to a reception circuit and transferring a transmission signal from a transmission circuit to the antenna while separating the reception signal and the transmission signal so that they do not mix.

Accordingly, a general branching filter has an antenna terminal connected to an antenna, a reception terminal connected to a reception circuit, and a transmission terminal connected to a transmission circuit.

Specifically, on a piezoelectric substrate or a substrate on which on a piezoelectric thin film is formed, a transmitting filter and a receiving filter are formed. This substrate (hereinafter also referred to as a "filter substrate") is mounted on a mounting substrate and sealed to form a branching filter. On the surface of the mounting substrate opposite to the surface where the filter substrate is mounted (hereinafter also referred to as a "terminal surface"), terminals are provided to be mounted on a motherboard of a mobile communication terminal. The terminals include, in addition to the antenna terminal, reception terminal, and transmission terminal, a ground terminal etc.

The branching filter is mounted on the motherboard of the mobile communication terminal for use. However, depending on the design of the mobile communication terminal, there are cases that a device in which the transmission terminal is located on the left side with respect to the antenna terminal and the reception terminal is located on the right side (hereinafter this positional relationship is also referred to as a "normal arrangement") is used and cases that a device in which, inversely, the transmission terminal is located on the right side with respect to the antenna terminal and the reception terminal is located on the left side (hereinafter this positional relationship is also referred to as a "mirror arrangement") is used. Patent Citation 1 discloses a branching filter with a mirror arrangement. Patent Citation 2 discloses a branching filter having a matching circuit provided inside the mounting substrate.

When producing a branching filter having the same electrical characteristics as those of the branching filter with a mirror arrangement while having terminals of a normal arrangement, it is sufficient to prepare one with both of the filter substrate and the mounting substrate inverted when viewed from the above. With this method, however, since usually the mounting substrate is made of a laminate of ceramics and/or resins, very expensive molds are required for manufacturing the mounting substrates for each of the normal arrangement and mirror arrangement. In particular, when providing a matching circuit inside the mounting substrate, the number of layers laminated increases, therefore a larger number of molds is necessary.

Patent Citation 1: Japanese Patent Publication (A) No. 2007-60412
Patent Citation 2: Japanese Patent Publication (A) No. 2003-249842

DISCLOSURE OF THE INVENTION

Problem to be Solved by the Invention

The present invention was completed in order to solve the above problems and an object thereof is to provide an electronic device in which the same members can be shared between the normal arrangement and the mirror arrangement.

Means for Solving the Problem

An electronic device according to an embodiment of the present invention is an electronic device provided with a piezoelectric substrate and a mounting substrate on which the piezoelectric substrate is mounted, wherein the piezoelectric substrate has, on a surface for mounting to the mounting substrate constituting a main surface, a piezoelectric substrate side electrode group including a first electrode, a second electrode, and a third electrode, the mounting substrate has, on a first main surface facing the main surface of the piezoelectric substrate, a first mounting substrate side electrode group including a plurality of electrode pads which are connected to the first electrode, the second electrode, and the third electrode and a dummy electrode pad which is not connected to any of the first electrode, the second electrode, and the third electrode and has, on a second main surface on the back of the first main surface, a second mounting substrate side electrode group including a plurality of terminal electrodes which are electrically connected to the first mounting substrate side electrode group and are connected to circuit interconnects of an external circuit board, and the first mounting substrate side electrode group and the second mounting substrate side electrode group are arranged line-symmetrically with respect to an axis of symmetry on the first main surface when viewed from the above, and the piezoelectric substrate side electrode group is arranged asymmetrically with respect to the axis of symmetry.

Further, an electronic device according to an embodiment of the present invention is an electronic device provided with a piezoelectric substrate and a mounting substrate on which the piezoelectric substrate is mounted, wherein the piezoelectric substrate has, on a surface for mounting to the mounting substrate constituting a main surface, a piezoelectric substrate side electrode group including a first electrode, a second electrode, and a third electrode, the mounting substrate has, on a first main surface facing the main surface of the piezoelectric substrate, a first mounting substrate side electrode group including a plurality of electrode pads which are connected to the first electrode, the second electrode, and the third electrode and a dummy electrode pad which is not connected to any of the first electrode, the second electrode, and the third electrode and has, on a second main surface on the back of the first main surface, a second mounting substrate side electrode group which is electrically connected to the first electrode group and is connected to circuit interconnects of an external circuit board, the first mounting substrate side electrode group is arranged to be 180° rotationally symmetrical with respect to the center of symmetry on the first main surface when viewed from the above, the second mounting substrate side electrode group is arranged to be line-symmetrical with respect to the axis of symmetry passing through the center of symmetry when viewed from the above, and the piezoelectric substrate side electrode group is arranged to be 180° rotationally symmetrical with respect to the center of symmetry when viewed from the above.

According to the electronic device described above, a mounting substrate capable of mounting both of a piezoelectric substrate for a normal arrangement and a piezoelectric substrate for a mirror arrangement is used, therefore two types of branching filters can be constituted by one mounting substrate.

BRIEF DESCRIPTION OF DRAWINGS

[FIG. 6] A plan view showing the arrangements of inner layer electrodes and vias of the mounting substrate in the branching filter of FIG. 2.

EXPLANATION OF REFERENCES

Figure 1A:
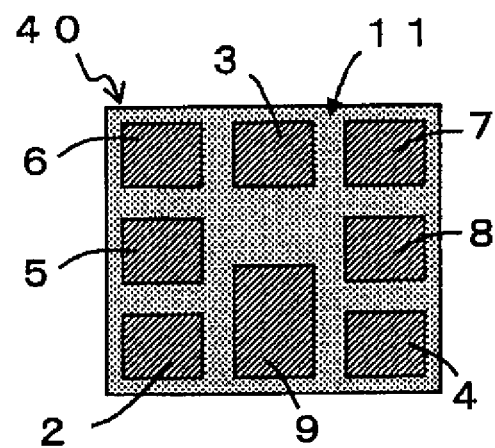
[FIGS. 1] A and B are plan views showing a second mounting substrate side electrode group formed on a second main surface of a mounting substrate in a branching filter as an embodiment of the present invention.

20: piezoelectric substrate
22: input electrode
24, 25: output electrodes
23: antenna electrode
26: transmission filter
27: reception filter
40: mounting substrate

BEST MODE FOR CARRYING OUT THE INVENTION

Below, an example of an embodiment of an electronic device of the present invention constituted by a branching filter is explained in detail with reference to the drawings. Note that, in the drawings explained below, the same portions are assigned the same notations. Further, distance between electrode fingers, thicknesses of the electrode fingers, number of electrode fingers, crossing widths of electrode fingers, etc. are schematically shown for explanation, but the invention is not limited to these.

<Example 1 of Embodiment>

Figure 2:
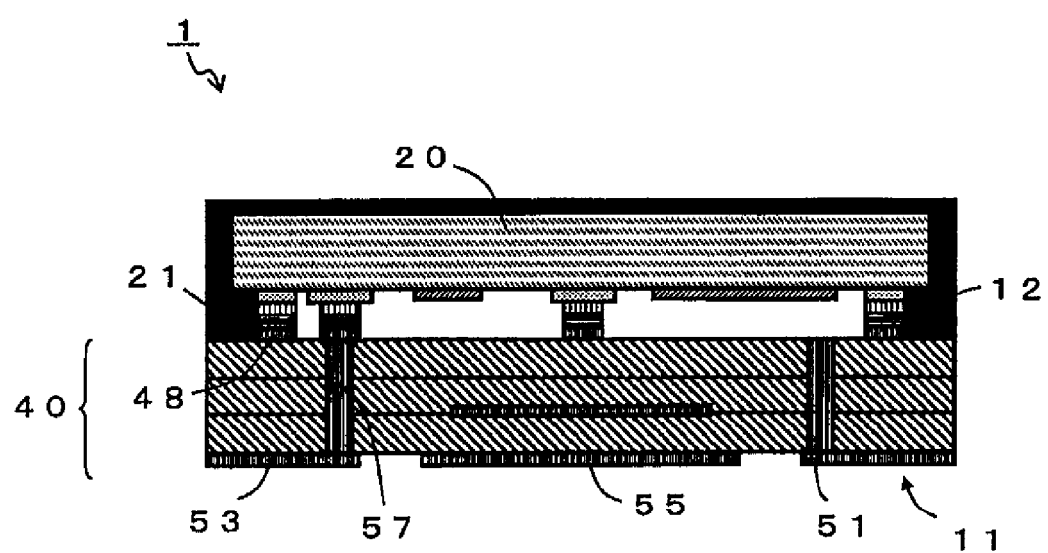
[FIG. 2] A cross-sectional view showing Example 1 of an embodiment of an electronic device (branching filter) of the present invention.

A cross-sectional view of a branching filter in Example 1 of an embodiment of the present invention is shown in FIG. 2.

Figure 4:
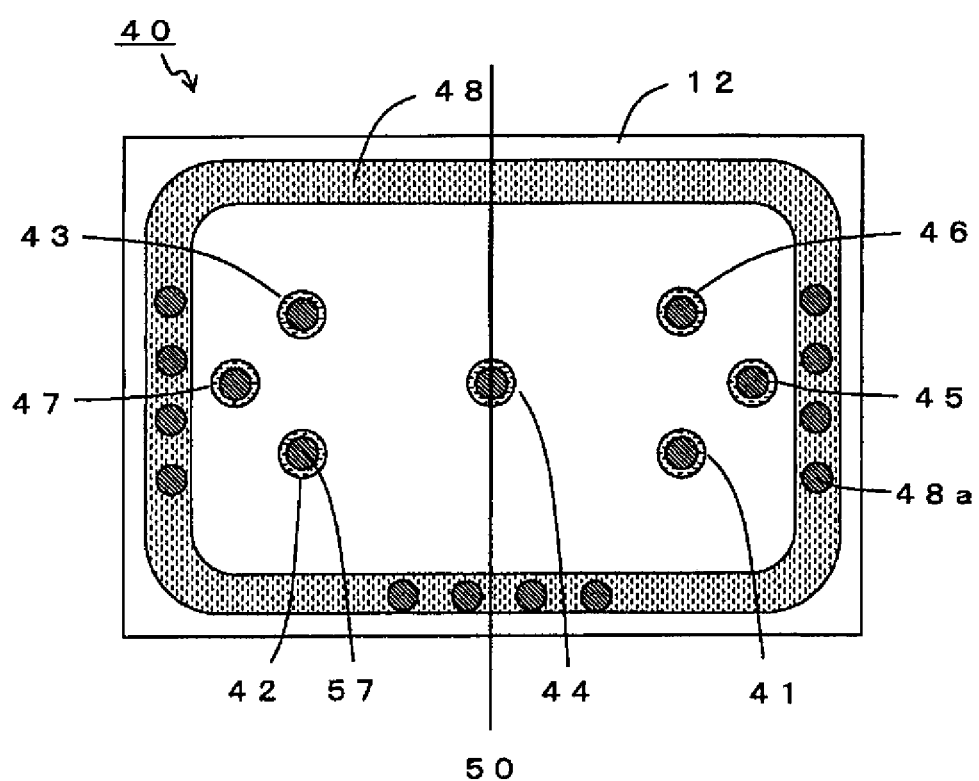
[FIG. 4] A plan view of a first main surface of the mounting substrate in the branching filter of FIG. 2.
Figure 5:
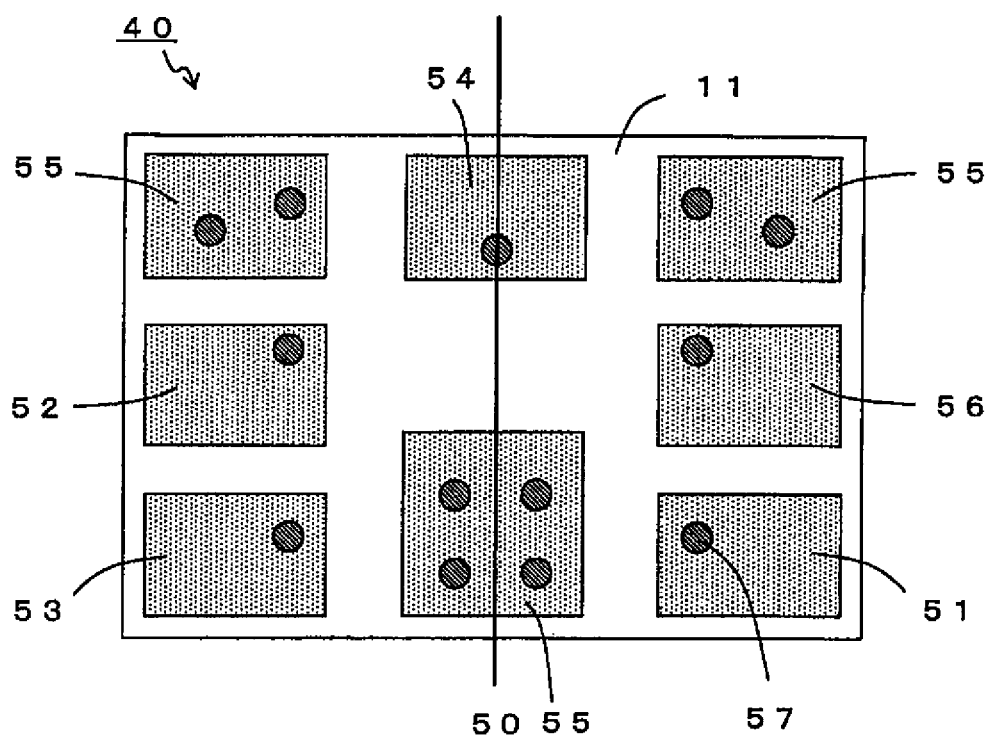
[FIG. 5] A plan view of a second main surface of the mounting substrate in the branching filter of FIG. 2.
Figure 10:
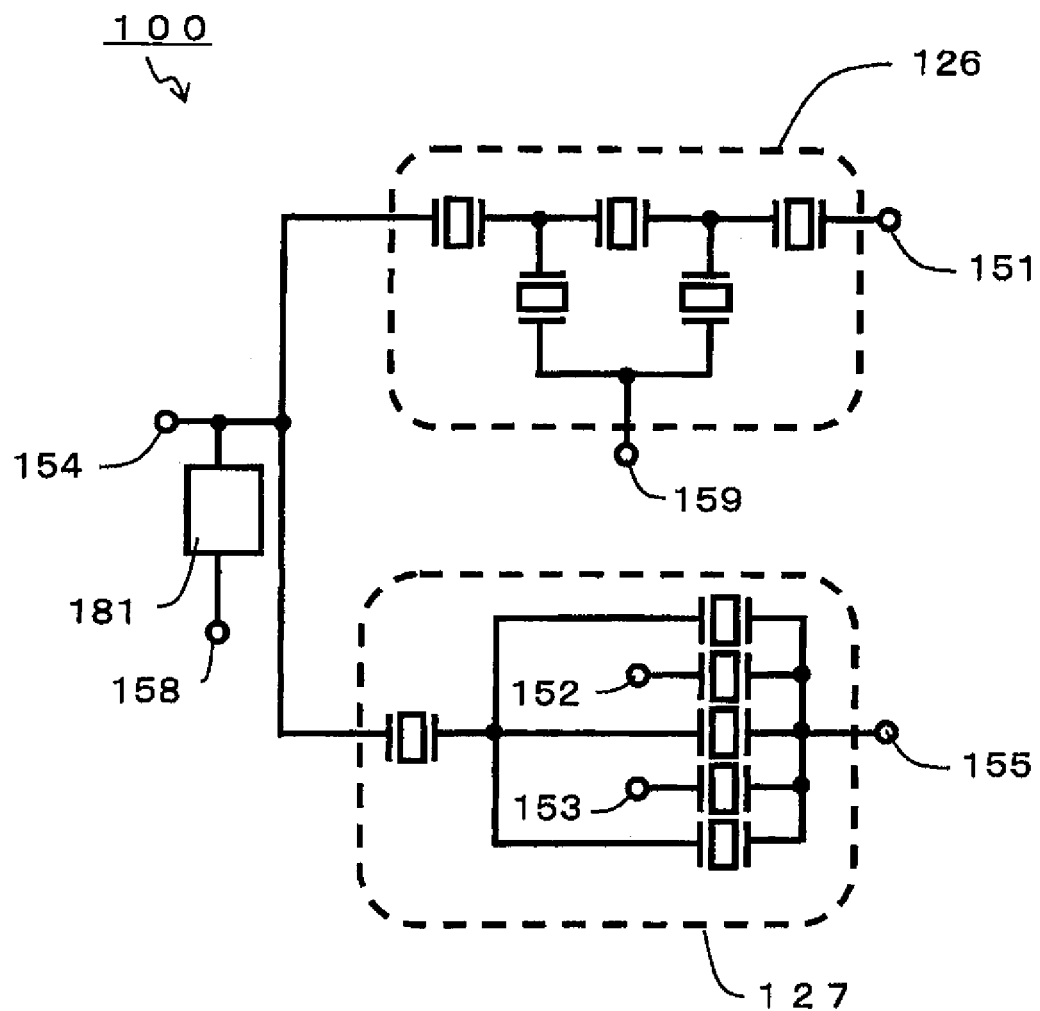
[FIG. 10] A block circuit diagram of a branching filter as an embodiment of the present invention.

As shown in FIG. 2, a branching filter 1 comprises a mounting substrate 40 on which a piezoelectric substrate 20 is flip-chip mounted. FIGS. 3 A and B show plan views of a main surface 21 of the piezoelectric substrate 20. FIG. 4 shows a plan view of a piezoelectric substrate mounting surface 12 of the mounting substrate 40, while FIG. 5 shows a plan view of a terminal surface 11. Further, FIG. 10 shows a block circuit diagram of a branching filter realized in the embodiment.

The branching filter 1 of the present example, as shown in FIG. 2, consists mainly of the piezoelectric substrate 20 and the mounting substrate 40 for mounting the piezoelectric substrate 20.

On the main surface 21 of the piezoelectric substrate 20, a transmission filter 26 having an input electrode 22 as a first electrode and a reception filter 27 having output electrodes 24 and 25 as second electrodes are formed. Further, in the present example, an antenna electrode 23 (third electrode) shared in common by the transmission filter 26 and the reception filter 27 is provided.

On the piezoelectric substrate mounting surface 12 (first main surface) of the mounting substrate 40, as shown in FIG. 4, a first mounting substrate side electrode group constituted by the input electrode 22, output electrodes 24 and 25, antenna electrode 23, and a plurality of electrode pads 41 to 48 connected to reference potential electrodes 30 and 33 is formed symmetrically with respect to a line when viewed from the above. Further, on the terminal surface 11 (second main surface) on the back of the piezoelectric substrate mounting surface 12, as shown in FIG. 5, a second mounting substrate side electrode group which is electrically connected to the first mounting substrate side electrode group and is constituted by a plurality of terminal electrodes 51 to 56 connected to circuit interconnects of an external circuit board is formed symmetrically with respect to a line when viewed from the above.

The transmission filter 26 and the reception filter 27 include, in addition to the input electrode 22, antenna electrode 23, and output electrodes 24 and 25, interconnect electrodes 29 connecting between one resonator and another resonator and between a resonator and an input/output electrode.

As the resonator, for example, a surface acoustic wave resonator including an IDT (Inter Digital Transducer) in which comb-shaped electrodes mesh with each other or a thin film bulk resonator, i.e., a so-called FBAR (film bulk acoustic resonator) vertically sandwiching a thin piezoelectric film by electrodes may be used.

The IDT electrode is composed of Al or an Al alloy (Al—Cu-based or Al—Ti-based) and is formed by a vapor deposition method, a sputtering method, a CVD method, or another thin film formation method. An electrode thickness of the IDT electrodes is preferably set to 0.1 to 0.5 μm for obtaining desired characteristics as the surface acoustic wave filter. In order to improve a power durability, a laminate structure of Al or an Al alloy and another metal such as Ti may be employed, or Cu, Au, or another metal having a high stress migration resistance may be used as well.

When using a surface acoustic wave resonator, for example, a substrate comprising a lithium tantalate ($LiTaO_3$) single crystal, a substrate comprising lithium niobate ($LiNbO_3$) single crystal, a substrate comprising a lithium borate ($LiBO_4$) single crystal, or the like may be used as the piezoelectric substrate 20. Specifically, the piezoelectric substrate 20 is preferably made of a 36°±3° Y-cut X-propagation lithium tantalate single crystal, 42°±3° Y-cut X-propagation lithium tantalite single crystal, a 64°±3° Y-cut X-propagation lithium niobate single crystal, a 41°±3° Y-cut X-propagation lithium niobate single crystal, or a 45°+3° X-cut Z-propagation lithium tetraborate single crystal so as to have a large electromechanical coupling coefficient and a small frequency temperature coefficient. Further, among these pyroelectric piezoelectric single crystals, piezoelectric substrate 20 having pyroelectricity remarkably reduced due to oxygen vacancies or solid solution of Fe or the like is good in view of reliability of the surface acoustic wave device.

Further, a substrate having no piezoelectric property on which a piezoelectric thin film of zinc oxide (ZnO), aluminum nitride (AlN), or the like is provided may also be used. Further, when using a FBAR, a substrate having no piezoelectric property on which a piezoelectric thin film of zinc oxide (ZnO), aluminum nitride (AlN), or the like is provided may also be used.

The thickness of the piezoelectric substrate 20 is preferably about 0.1 to 0.5 mm. If it is less than 0.1 mm, the piezoelectric substrate 20 becomes brittle. If it exceeds 0.5 mm, the material costs and parts dimension become large, so it is not suitable for use. However, in a case of using a piezoelectric substrate bonded to a substrate made of a material having a high strength such as a ceramic, Si, or $Al_2O_3$, the thickness of the piezoelectric substrate may be less than 0.1 mm.

In the present example, an example of using surface acoustic wave resonators for forming a transmission filter of a ladder type and a reception filter of a longitudinally coupled multimode (hereinafter also referred to as a DMS (double-mode SAW)) is explained.

Figure 3A:
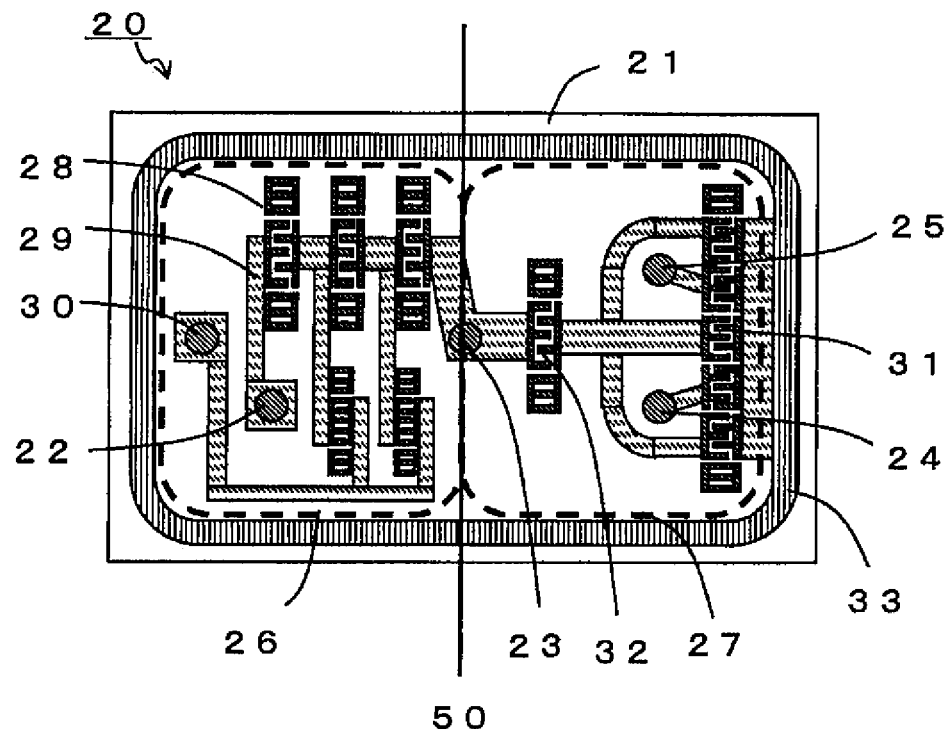
[FIG. 3] A is a plan view of a piezoelectric substrate in the branching filter of FIG. 2, and B is a plan view of a piezoelectric substrate in which a first mounting substrate side electrode group of A is given a mirror arrangement.

As shown in FIG. 3A, the portion surrounded by a broken line on the left is the transmission filter 26, and the portion surrounded by a broken line on the right is the reception filter 27. The antenna electrode 23 is located above a virtual line 50 equally dividing the piezoelectric substrate 20 into two and is shared by both filters. Further, the input electrode 22 of the transmission filter 26 and one output electrode 24 of the reception filter 27 are arranged at positions to be symmetrical with respect to the virtual line 50. On the other hand, for the other output electrode 25 of the reception filter 27, there is no other electrode at a position symmetrical with respect to the virtual line 50. In the same way, for the reference potential electrode 30 of the transmission filter 26, there is no other electrode at a position symmetrical with respect to the virtual line 50. Namely, in the piezoelectric substrate side electrode group formed on the piezoelectric substrate 21 and constituted by the input electrode 22, output electrodes 24 and 25, and antenna electrode 23, while part of the electrodes are symmetrically arranged with respect to the virtual line 50, the rest of the electrodes are not symmetrically arranged with each other. In other words, the piezoelectric substrate side electrode group is in a state of asymmetrical arrangement with respect to the virtual line 50.

The transmission filter 26 is a ladder type filter. The surface acoustic wave resonators 28 are arranged at series arms and parallel arms. Further, a reference potential electrode 30 of the transmission filter 26 is provided. The reception filter 27 is a DMS filter. In the case of this example, five IDT electrodes 51 are arranged along the propagation direction of the surface acoustic wave. Further, the resonator 32 in series with the DMS filter is provided on the antenna electrode 23 side. In the present example, an annular electrode 33 is used as the reference potential electrode of the DMS filter. Note that, "reference potential use" generally means "ground use" showing a zero potential. However, it may also show a potential slightly deviated from the zero potential as well.

The mounting substrate 40, as shown in FIG. 4, has a first mounting substrate side electrode group connected to the transmission filter 26 and the reception filter 27, which are formed on the piezoelectric substrate, on the piezoelectric substrate mounting surface 12. Specifically, the first mounting substrate side electrode group is constituted by an electrode pad 41 connected to the input electrode 22 of the transmission filter 26 on the piezoelectric substrate 20, electrode pads 42 and 43 connected to the output electrodes 24 and 25 of the reception filter 27, an electrode pad 44 connected to the antenna electrode 23, an electrode pad 45 connected to the reference potential electrode 30 of the transmission filter 26, and a ring-shaped electrode pad 48 connected to the ring-shaped electrode 33 serving as the reference potential electrode of the reception filter 27.

As shown in FIG. 4, a through conductor 48a which electrically connects the ring-shaped electrode pad 48 and a ring-shaped conductor (ring-shaped conductor shown in a second plan view from the top of FIG. 6) provided in an inner layer of the mounting substrate 40 is connected to a lower surface of the ring-shaped electrode pad 48.

Further, dummy electrode pads 46 and 47 which are connected to neither the transmission filter 26 nor the reception filter 27 are formed. The dummy electrode pad 46 is located at a position symmetrical to the electrode pad 43 with respect to the virtual line 50 equally dividing the mounting substrate 40 into two. Further, the dummy electrode pad 47 is located at a position symmetrical to the electrode pad 45 with respect to the virtual line 50. Namely, the dummy electrode pads 46 and 47 are included in the first mounting substrate side electrode group as well.

Further, on the terminal surface 11, the mounting substrate 40 has a second mounting substrate side electrode group connected to an external circuit board (not shown). The second mounting substrate side electrode group includes a terminal electrode 51 connected to a transmission circuit of the external circuit board, terminal electrodes 52 and 53 connected to a reception circuit of the external circuit board, a terminal electrode 54 connected to an antenna, and a terminal electrode 55 connected to a ground electrode of the external circuit board. In the present example, a case of using a balanced signal output type DMS filter as the reception filter is explained. For this reason, the terminal electrodes 52 and 53 connected to the reception circuit are constituted by two electrodes outputting two signals, which have almost the same amplitudes, but are different in phase by about 180°, to the reception circuit. Further, a terminal electrode 56 functioning as a dummy terminal electrode which is connected to the external circuit board, but is not connected to a circuit in the external circuit board is included. Namely, the dummy terminal electrode 56 is included in the second mounting substrate side electrode group as well. Note that, the terminal electrodes constituting the second mounting substrate side electrode group may have a notch or the like for facilitating recognition of orientation when mounting the branching filter 1 on the external circuit board.

Further, the mounting substrate 40 includes a matching circuit and other additional circuits inside. The mounting substrate 40 is formed of a dielectric multi-layer substrate as shown in FIG. 2 and has inner layer electrodes between the terminal surface 11 and the piezoelectric substrate mounting surface 12. The inner layer electrodes are connected to each other by vias (through conductors) 57, and the electrodes on the piezoelectric substrate 20 and the terminal electrodes are connected through these.

Now, the piezoelectric substrate 20 of FIG. 3A can be flip-chip mounted on the piezoelectric substrate mounting surface 12 of the mounting substrate 40 having electrodes at positions corresponding to the electrodes on the piezoelectric substrate 20 as shown in FIG. 4. At that time, as previously explained, the terminal electrode 51 of the terminal surface 11 is connected to the transmission circuit, the terminal electrode 54 is connected to the antenna, the terminal electrodes 52 and 53 are connected to the reception circuit, and the terminal electrode 55 is connected to the ground electrode. The terminal electrode 56 is connected to the external circuit board, but is not connected to any circuit inside the external circuit board.

Figure 3B:
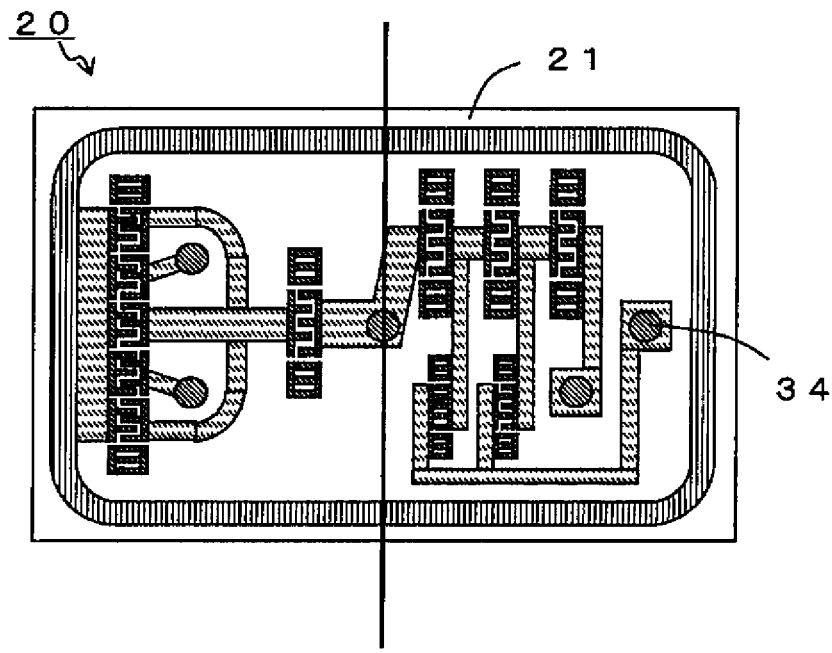

FIG. 3B shows another piezoelectric substrate 21 which comprises a transmission filter 26 and a reception filter 27 having the same circuit configurations as the piezoelectric substrate 21 shown in FIG. 3A but has a different layout of electrodes. Specifically, the piezoelectric substrate 21 shown in FIG. 3B is obtained by inverting the layout of FIG. 3A line-symmetrically about the virtual line 50. The piezoelectric substrate 21 shown in FIG. 3B can be flip-chip mounted on the piezoelectric substrate mounting surface 12 of the mounting substrate 40 of FIG. 4.

Figure 1B:
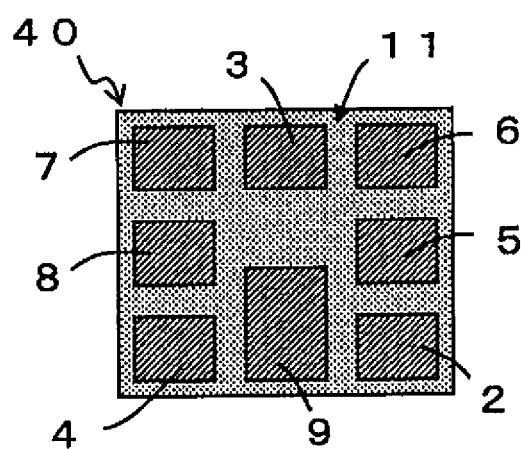

In this case, assuming that the terminal electrode 53 formed on the terminal surface 11 is connected to the transmission circuit, the terminal electrode 54 is connected to the antenna, the terminal electrodes 51 and 56 are connected to the reception circuit, and the terminal electrode 55 is connected to the ground electrode and that the terminal electrode 52 is connected to the external circuit board, but is not connected to any circuit inside the external circuit board, a branching filter of FIG. 1B having a mirror arrangement with respect to FIG. 1A can be realized. That is, both of the normal arrangement and the mirror arrangement can be realized by using the same mounting substrate 40. Both of the normal arrangement and mirror arrangement have a circuit configuration of the block circuit diagram shown in FIG. 10.

Figure 8:
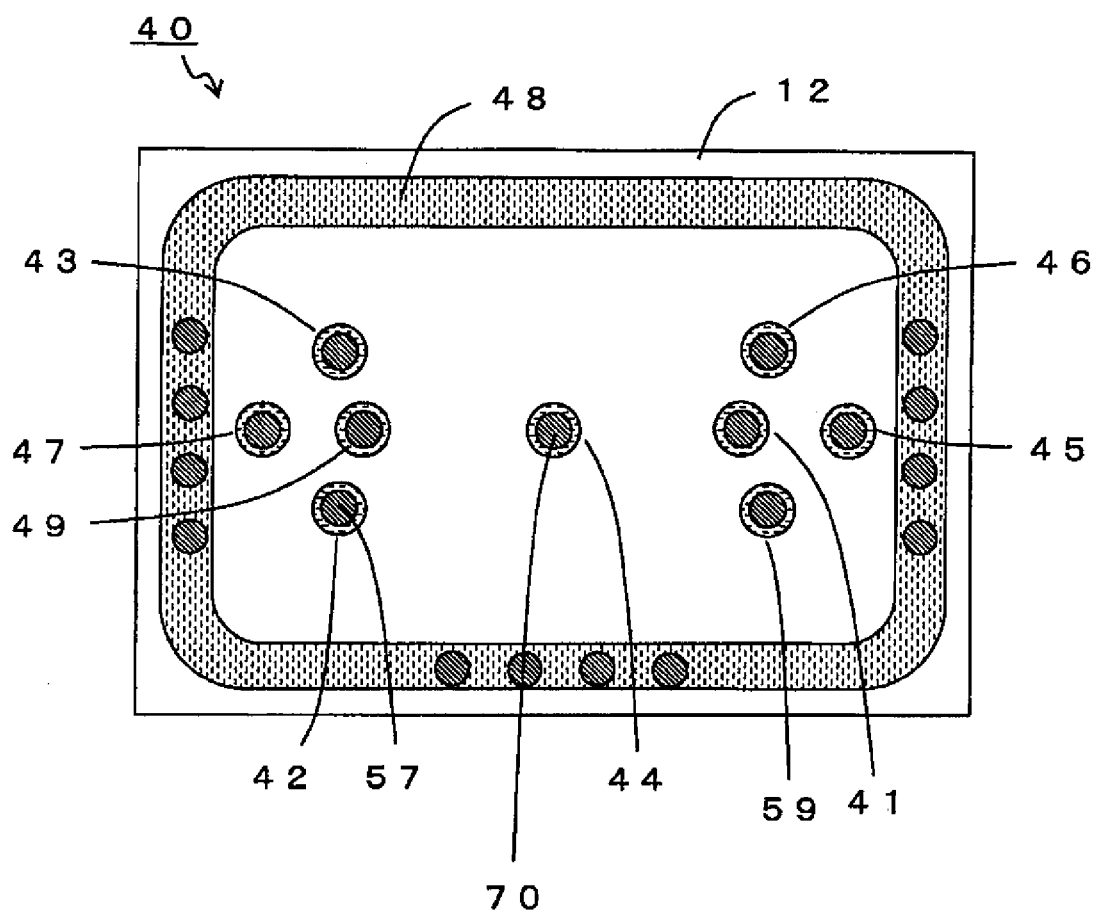
[FIG. 8] A plan view of the mounting substrate in the branching filter of FIG. 7A.

In the present example, the transmission terminal 2 in FIGS. 1A and B corresponds to the terminal electrode 51 or the terminal electrode 53 of FIG. 5. The antenna terminal 3 corresponds to the terminal electrode 54 of FIG. 5. The reception terminal 4 corresponds to the terminal electrode 53 or terminal electrode 51 of FIG. 5. While in the description of the conventional example above, reference numerals 5, 6, 7, 8, and 9 indicate ground terminals, in the present example, 5 of FIGS. 1A and B is the terminal electrode 56 or terminal electrode 52 of FIGS. 5, and 8 is the terminal electrode 52 or terminal electrode 56 of FIG. 5. The ground electrodes 6, 7, and 9 correspond to the terminal electrodes 55 of FIG. 5.

Further, the block circuit diagram of FIG. 10 shows the configuration of the branching filter 1 of the present example. Reference numeral 154 of FIG. 10 corresponds to the terminal electrode 54 of FIG. 5. Reference numeral 151 corresponds to the terminal electrode 51 or terminal electrode 53 of FIG. 5. Reference numeral 153 corresponds to the terminal electrode 53 or terminal electrode 51 of FIG. 5. Reference numeral 156 corresponds to the terminal electrode 56 or terminal electrode 52 of FIG. 5. Reference numerals 155, 158, and 159 correspond to the terminal electrodes 55 of FIG. 5. Reference numeral 126 corresponds to the transmission filter 26 of FIG. 3A. Reference numeral 127 corresponds to the reception filter 27 of FIG. 3A. Reference numeral 181 is a matching circuit for impedance matching between the transmission filter and the reception filter, and in the present example, it is constituted by inner layer electrodes 80 and 81 of FIG. 6 which is explained next.

FIG. 6 is a diagram showing inner layer electrodes and vias of each layer of the dielectric multi-layer film of the mounting substrate 40. Inner layer electrodes 60 and 61 are line patterns having inductance components which are connected to the ground electrodes 30 and 34 of the transmission filter in the case of the normal arrangement or mirror arrangement. In a ladder type filter, by adjusting this inductance component, an out-of-band attenuation amount can be adjusted. By symmetrically arranging the inner layer electrode 60 and inner layer electrode 61 with respect to the virtual line 50, it becomes possible to adjust the inductance components of the ladder type filter in both of the normal arrangement and the mirror arrangement.

On the other hand, a DMS filter is used as the reception filter, but a DMS filter has tendency to deteriorate in attenuation amount and become poorer in degree of balance unless the potential of the ground electrode is stable. Accordingly, desirably a ground potential which is as stable as possible is realized on the piezoelectric substrate 20. However, in the present example, the ring-shaped electrode 33 is connected to the ground electrode using a plurality of vias, therefore a stable ground potential approximating the true ground potential can be realized. Further, in order to secure a stable ground potential even when employing an arrangement symmetrical with respect to the virtual line 50 when viewed from the above and to maintain a small sized shape by decreasing the number of dummy electrodes pads as much as possible, use of the ring-shaped electrode 33 as the ground electrode is extremely advantageous.

The distances between the input electrode 22 of the transmission filter 26 and the output electrodes 24 and 25 of the reception filter 27 are preferably as large as possible. This is because, when these are close to each other, a high power signal passing through the transmission filter 26 is leaked to the reception filter 27, and isolation characteristics deteriorate.

When using a balanced output type filter as the reception filter 27, two output electrodes 24 and 25 of the reception filter 27 become necessary. Further, in order to keep the good degree of balance, preferably the electrical distances from the antenna terminal up to the two output electrodes 24 and 25 are almost equal. In view of the above configuration and convenience of correctly connecting electrodes of the piezoelectric substrate on which electrodes are formed at positions symmetrical with respect to the virtual line 50 and electrodes of the mounting substrate 40, preferably the antenna electrode 23 is located at the center of the piezoelectric substrate 20, and the input electrode 22 of the transmission filter 26 and the output electrodes 24 and 25 of the reception filter 27 exist at diagonal positions of the main surface of the rectangular piezoelectric substrate 20.

As the dielectric body forming the mounting substrate 40, an LTCC (low temperature co-fired ceramic), FR-4 (flame retardant type 4 glass epoxy resin), or the like may be used. As the inner layer electrodes, a metal containing silver, copper, gold, tungsten, or the like as a main component may be used.

According to the above example of the embodiment, as described above, the mounting substrate 40 on which both of the piezoelectric substrate 20 for the normal arrangement (FIG. 3A) and the piezoelectric substrate 20 for the mirror arrangement (FIG. 3B) can be mounted is used, therefore two types of branching filters can be formed by one mounting substrate 40. Accordingly, it is not necessary to prepare mounting substrates for each of normal arrangement and mirror arrangement and molds or the like for manufacturing each of the mounting substrates. As a result, the manufacturing costs for manufacturing the branching filters can be greatly reduced. Further, inventory management of the mounting substrates also becomes easier. When inspecting the electrical characteristics of the transmission filter and reception filter on the piezoelectric substrate before mounting on the mounting substrate, the layouts such as connections of an inspection unit do not have to be changed between the piezoelectric substrate for the normal arrangement and the piezoelectric substrate for the mirror arrangement. As a result, the process takt time can be improved.

By forming dummy electrode pads 46 and 47, which are electrically independent from the transmission filter 26 and reception filter 27, on the piezoelectric substrate mounting surface 12 of the mounting substrate 40, the layout of electrodes on the piezoelectric substrate 20 can have flexibility. Accordingly, design of the filter becomes easy. In particular, this is advantageous for expression of almost the same electrical characteristics between the normal arrangement and the mirror arrangement.

By forming the dummy terminal electrode 56, which is electrically independent from the circuit interconnects of the external circuit board, on the terminal surface 11 of the mounting substrate 40, reliability of connection between the external circuit board and the branching filter 1 can be secured. Further, this is advantageous for exhibiting almost the same electrical characteristics between the normal arrangement and the mirror arrangement.

The mounting substrate 40 has a matching circuit 181 for matching impedance of the transmission filter 26 and the reception filter 27 inside, therefore the characteristics of the branching filter 1 can be expressed without separately providing a circuit element for adjustment on the external circuit board.

The transmission filter 26 is an unbalanced signal input type, while the reception filter 27 is a balanced signal output type, therefore the received signal can be converted to a balanced signal without interposing a balun or other balancing circuit.

On the main surface 21 of the piezoelectric substrate 20, a ring-shaped electrode 33 surrounding the transmission filter 26 and the reception filter 27 is formed, and a ring-shaped electrode pad 48 connected to the ring-shaped electrode 33 is formed on the first main surface of the mounting substrate 40. Accordingly, the transmission filter 26 and the reception filter 27 can be air-tightly sealed. Consequently, a branching filter 1 excellent in reliability can be realized.

By connecting the ring-shaped electrode pad 48 to the ground electrode formed on the external circuit board, the ring-shaped electrode 33 can be utilized as the ground electrode of the MS filter. By providing many through conductors 48a in a wide area of the ring-shaped electrode pad 48 to connect the ring-shaped electrode 33 to the electrode 55 (ground terminal) of the terminal surface 11, a stable ground potential can be provided on the piezoelectric substrate 20, therefore this is advantageous for stably expressing the characteristics of the DMS filter. Further, the ring-shaped electrode 33 is present in an outer peripheral portion of the piezoelectric substrate 20 in both of the normal arrangement case and mirror arrangement case irrespective of the internal filter configuration, therefore the ground potential can be secured even if a ground electrode is not separately provided. As a result, even when the numbers of reference potential electrodes necessary in the transmission filter 26 and in the reception filter 27 are different, the number of dummy electrodes which are necessary for sharing the mounting substrate in the normal arrangement and mirror arrangement can be decreased. As a result, the branching filter 1 can be reduced more in size.

Further, the branching filter according to the example of the present embodiment is manufactured as follows. First, a piezoelectric substrate 20 is prepared in which a transmission filter 26 having an input electrode 22 and a reception filter 27 having output electrodes 24 and 25 are formed on the main surface and the piezoelectric substrate side electrode group including the input electrode 22, output electrodes 24 and 25, and antenna electrode 23 is asymmetrically arranged with respect to a first axis of symmetry on the main surface. Simultaneously, a mounting substrate 40 is prepared in which a first mounting substrate side electrode group connected to the input electrode 22, output electrodes 24 and 25, and antenna electrode 23 is formed on the first main surface line-symmetrically with respect to a second axis of symmetry when viewed from the above and a second mounting substrate side electrode group electrically connected to the first mounting substrate side electrode group and connected to the circuit interconnects of the external circuit board is formed on the second main surface on the back of the first main surface line-symmetrically with respect to the second axis of symmetry when viewed from the above.

Finally, the main surface of the piezoelectric substrate 20 is mounted on the first main surface of the mounting substrate so that the first axis of symmetry coincides with the second axis of symmetry.

<Example 2 of Embodiment>

Figure 7A:
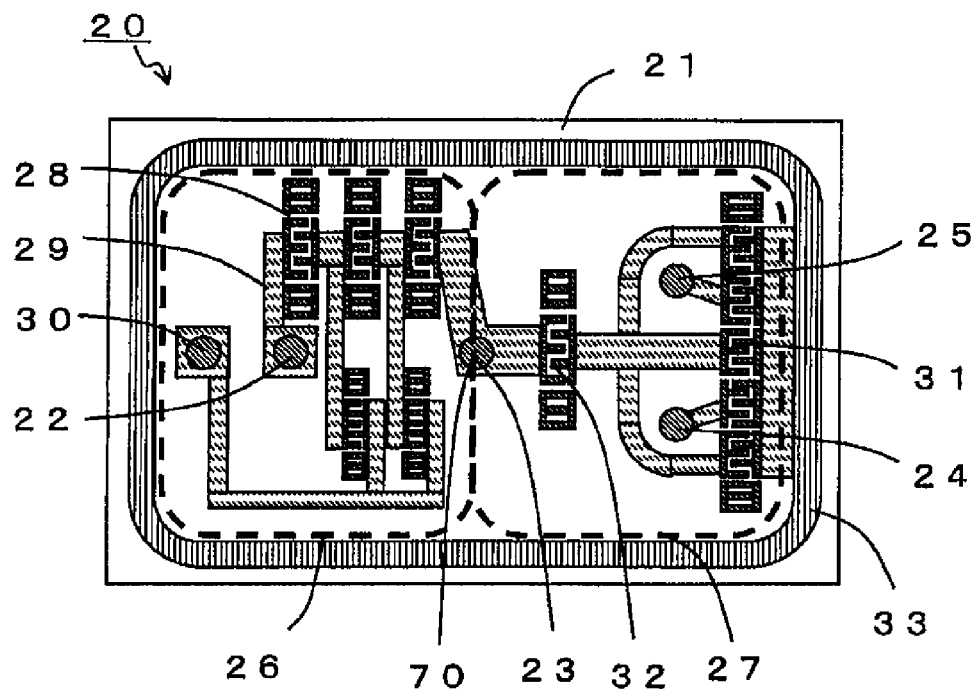
[FIG. 7] A is a plan view of a piezoelectric substrate showing Example 2 of an embodiment of an electronic device (branching filter) of the present invention, and B is a plan view of a piezoelectric substrate in which the electrode group of A is given a mirror arrangement.
Figure 9:
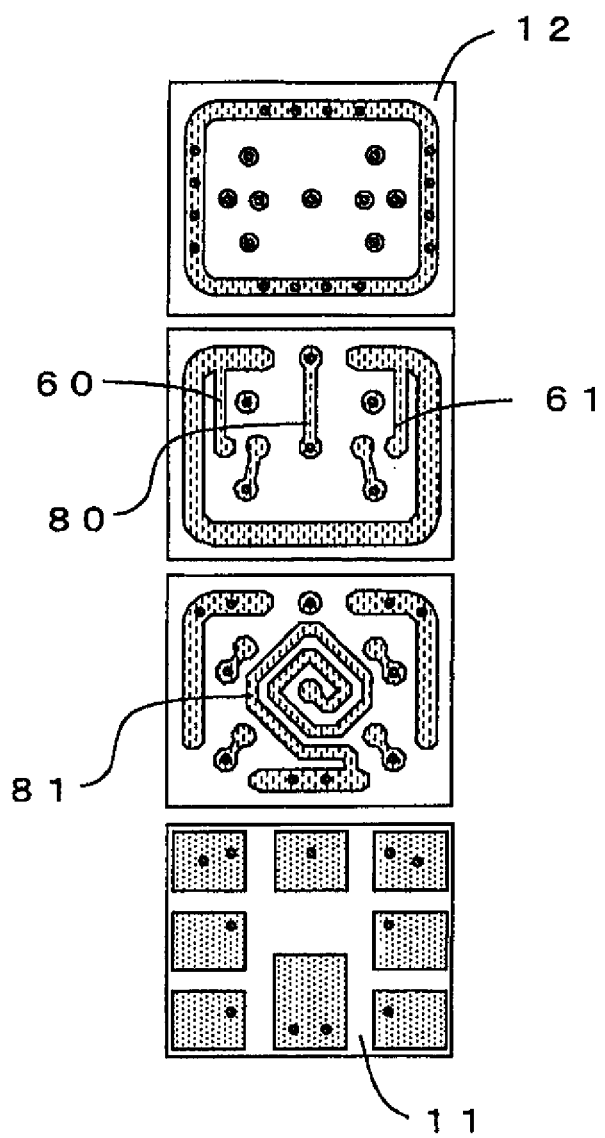
[FIG. 9] A plan view showing the arrangements of inner layer electrodes and vias of the mounting substrate in the branching filter of FIG. 7A.

FIG. 7A shows a plan view of the main surface 21 of the piezoelectric substrate 20 in Example 2 of the embodiment of the branching filter of the present example. Further, FIG. 8 shows a plan view of the piezoelectric substrate mounting surface 12 of the mounting substrate 40. Further, FIG. 9 shows inner layer electrodes and vias of layers of a dielectric multi-layer film of the mounting substrate 40.

In the present example, while the circuit configuration is the same as Example 1 of the embodiment, a filter in which the position of the input electrode 22 of the transmission filter is changed, the first mounting substrate side electrode group and inner layer electrodes of the piezoelectric substrate mounting surface 12 of the mounting substrate 40 are changed, and the same piezoelectric substrate 20 is rotated by 180° within the main surface can be mounted on the mounting substrate 40.

The branching filter 1 of the example of the present embodiment is, as in the branching filter shown in Example 1 of the embodiment, constituted mainly by a piezoelectric substrate 20 and a mounting substrate 40 for mounting the piezoelectric substrate 20. The piezoelectric substrate 20 is mounted in a state where its main surface 21 faces the piezoelectric substrate mounting surface 12 which is the first main surface of the mounting substrate 40.

On the main surface of the piezoelectric substrate 20, a transmission filter 26 having an input electrode 22 and transmission antenna electrode and a reception filter 27 having output electrodes 24 and 25 and a reception antenna electrode are formed. Note that, in the present example, the transmission antenna electrode and the reception antenna electrode are formed by the same antenna electrode 23. Namely, the antenna electrode 23 is shared by the transmission filter 26 and the reception filter 27.

On the first main surface of the mounting substrate 40, as shown in FIG. 8, a first mounting substrate side electrode group including a plurality of electrode pads 41 to 49 connected to the input electrode 22, output electrodes 24 and 25, and an antenna electrode 23 is formed to be 180° rotationally symmetrically when viewed from the above. Further, on the second main surface on the back of the piezoelectric substrate mounting surface 12 of the mounting substrate 40 constituted by the terminal surface 11, the second mounting substrate side electrode group electrically connected to the first mounting substrate side electrode group and connected to the circuit interconnects of the external circuit board is formed line-symmetrically when viewed from the above.

In this case, in order to decrease the number of dummy electrodes as much as possible and reduce the size of the piezoelectric substrate 20, the antenna electrode 23 is preferably located at the center of the piezoelectric substrate 20.

FIG. 7A is a plan view of the main surface 21 of the piezoelectric substrate 20. The portion surrounded by the left broken line is the transmission filter 26, and the portion surrounded by the right broken line is the reception filter 27. The antenna electrode 23 is located above a virtual point 70 showing the center of the piezoelectric substrate 20 and is shared by both filters.

The transmission filter 26 is a ladder type filter. The surface acoustic wave resonators 28 are arranged at series arms and parallel arms, and the reference potential electrode 30 of the transmission filter 26 is provided. The reception filter 27 is a DMS filter. In the case of this example, five IDT electrodes 51 are arranged along the propagation direction of the surface acoustic wave. Further, in series with the DMS filter, the resonator 32 is provided on the antenna electrode 23 side. In the present example, the ring-shaped electrode 33 is used as the reference potential electrode of the DMS filter.

The mounting substrate 40 has, on the piezoelectric substrate mounting surface 12, a first mounting substrate side electrode group connected to the transmission filter 26 and reception filter 27 formed on the piezoelectric substrate 20. The first mounting substrate side electrode group includes the electrode pad 41 connected to the input electrode 22 of the transmission filter 26 on the piezoelectric substrate 20, the electrode pads 42 and 43 connected to the output electrodes 24 and 25 of the reception filter 27, the electrode pad 44 connected to the antenna electrode 23, the electrode pad 45 connected to the reference potential electrode 30 of the transmission filter 26, and the ring-shaped electrode pad 48 connected to the reference potential electrode of the reception filter 27 constituted by the ring-shaped electrode 33.

In the present example, dummy electrode pads 46, 59, 47, and 49 connected to neither the transmission filter 26 nor the reception filter 27 are formed. The electrode pad 46 is located at a position rotationally symmetrical 180° with the electrode pad 42 with respect to the virtual point 70 showing the center of the mounting substrate 40 when viewed from the above. Further, the electrode pad 59 is located at a position rotationally symmetrical 180° with the electrode pad 43 with respect to the virtual point 70. Further, the electrode pad 47 is located at the position rotational symmetrical by 180° with the electrode pad 45 with respect to the virtual point 70 when viewed from the above. Further, the electrode pad 49 is located at the position rotational symmetrical by 180° with the electrode pad 41 when viewed from the above with respect to the virtual point 70 when viewed from the above. Namely, the first mounting substrate side electrode group includes the dummy electrode pads 46, 59, 47, and 49 as well.

Further, as shown in FIG. 5, the mounting substrate 40 has, on the terminal surface 11, a second mounting substrate side electrode group connected to the external circuit board (not shown). The second mounting substrate side electrode group includes the terminal electrode 51 connected to the transmission circuit of the external circuit board, the terminal electrodes 52 and 53 connected to the reception circuit of the external circuit board, the terminal electrode 54 connected to the antenna, and the terminal electrodes 55 connected to the ground electrodes of the external circuit board.

In the present example, an example using a balanced signal output type DMS filter for the reception filter 27 is explained. In this case, the electrodes connected to the reception circuit comprise two electrodes outputting two signals, which have almost the same amplitudes, but are different in phase by about 180°, to the reception circuit. Further, the dummy terminal electrode 56 which is connected to the external circuit board, but is not connected to a circuit in the external circuit board is included.

Further, the mounting substrate 40 includes a matching circuit and other additional circuits inside. The mounting substrate 40 comprises a dielectric multi-layer substrate as shown in FIG. 2 and has inner layer electrodes between the terminal surface 11 and the piezoelectric substrate mounting surface 12. The inner layer electrodes are connected by vias 57. Electrodes on the piezoelectric substrate 20 and terminal electrodes are connected through these.

In this regard, the piezoelectric substrate 20 of FIG. 7A can be flip-chip mounted on the piezoelectric substrate mounting surface 12 of the mounting substrate 40 of FIG. 8 having electrodes at positions corresponding to the electrodes on the piezoelectric substrate 20. At that time, as explained above, the terminal electrode 51 formed on the terminal surface 11 is connected to the transmission circuit, the terminal electrode 54 is connected to the antenna, the terminal electrodes 52 and 53 are connected to the reception circuit, and the terminal electrodes 55 are connected to the ground electrodes, while the dummy terminal electrode 56 is connected to the external circuit board, but is not connected to circuits in the external circuit board.

Figure 7B:
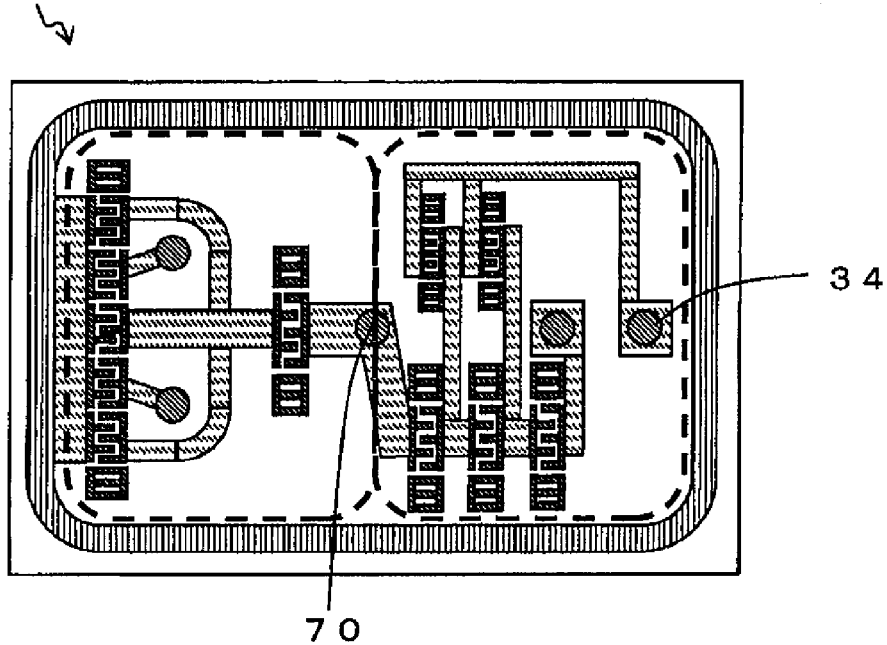

On the other hand, the piezoelectric substrate 20 shown in FIG. 7B obtained by inverting the layout of FIG. 7A rotationally symmetrically 180° with respect to the virtual point 70 as the center when viewed from the above can be flip-chip mounted on the piezoelectric substrate mounting surface 12 of the mounting substrate 40 of FIG. 8 having the electrodes at positions corresponding to the electrodes on the piezoelectric substrate 20.

In this case, assuming that the terminal electrode 53 formed on the terminal surface 11 is connected to the transmission circuit, the terminal electrode 54 is connected to the antenna, the terminal electrodes 51 and 56 are connected to the reception circuit, the terminal electrodes 55 are connected to the ground electrodes, and the terminal electrode 52 is connected to the external circuit board, but is not connected to the circuits in the external circuit board, the branching filter of FIG. 1B having a mirror arrangement with respect to FIG. 1A can be realized. That is, both of the normal arrangement and the mirror arrangement can be realized by using the same mounting substrate 40. In both of the normal arrangement and the mirror arrangement, the circuit configuration of the block circuit diagram shown in FIG. 10 is exhibited.

FIG. 9 is a plan view showing the inner layer electrodes and vias of layers of the dielectric multi-layer film of the mounting substrate 40. The inner layer electrodes 60 and 61 are line patterns having inductance components which are connected to the ground electrodes 30 and 34 of the transmission filter at the time of the normal arrangement or mirror arrangement. In a ladder type filter, by adjusting this inductance component, the amount of out-of-band attenuation can be adjusted.

Due to this, by using the same piezoelectric substrate 20 and the same mounting substrate 40, both of the normal arrangement and mirror arrangement can be realized, so the manufacturing costs can be greatly reduced.

Further, the advantages of use of the ring-shaped electrode 33 are the same as the advantages explained in Example 1 of the embodiment described above.

The branching filter of the present example is prepared as follows. First, a piezoelectric substrate 20 is prepared in which a transmission filter 26 having an input electrode 22 and a reception filter 27 having output electrodes 24 and 25 are formed on the main surface and the piezoelectric substrate side electrode group including the input electrode 22, output electrodes 24 and 25, and an antenna electrode 23 is asymmetrically arranged with respect to a first axis of symmetry on the main surface.

Simultaneously, a mounting substrate 40 is prepared in which a first mounting substrate side electrode group including a plurality of electrode pads connected to the input electrode 22, output electrodes 24 and 25, and an antenna electrode 23 is formed on the first main surface rotationally symmetrically by 180° with respect to a second center of symmetry when viewed from the above and the second mounting substrate side electrode group electrically connected to the first mounting substrate side electrode group and connected to the circuit interconnects of the external circuit board is formed on the second main surface on the back of the first main surface line-symmetrically with respect to the axis of symmetry passing through a second center of symmetry when viewed from the above.

Finally, the main surface of the piezoelectric substrate 20 is made to face the first main surface of the mounting substrate 40 so that the first center of symmetry coincides with the second center of symmetry and is mounted there to thereby prepare a branching filter.

<Example 3 of Embodiment>

Figure 11:
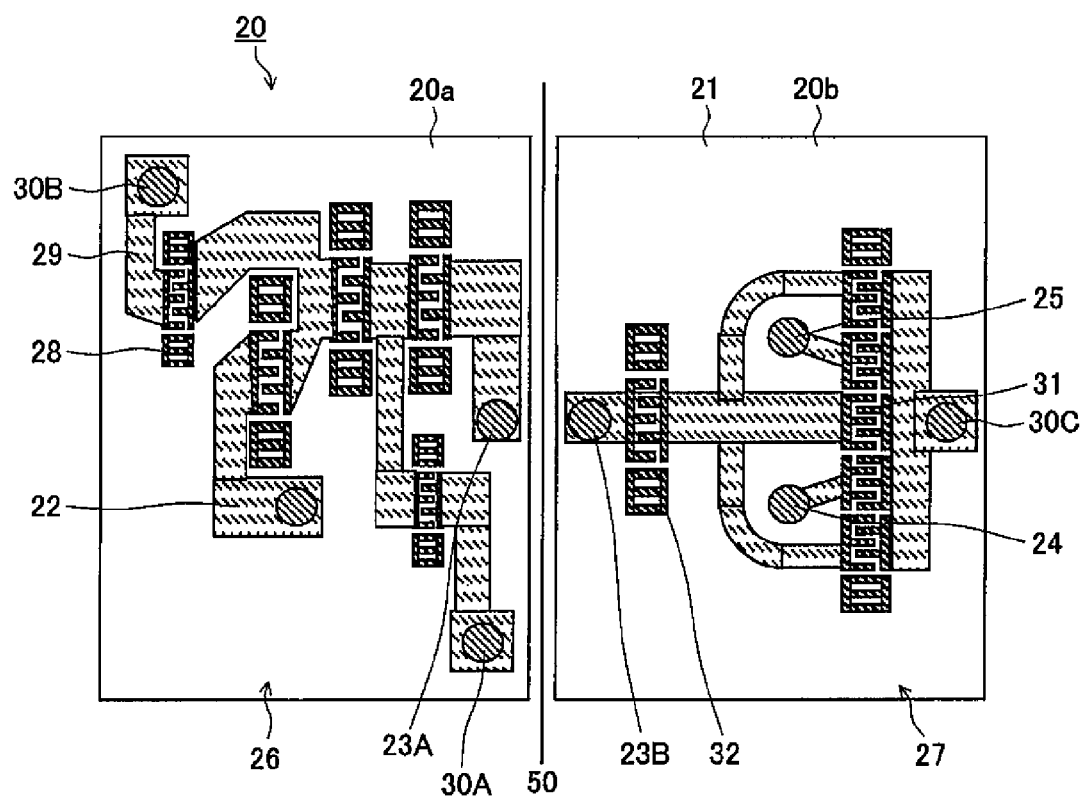
[FIG. 11] A plan view of a piezoelectric substrate showing Example 3 of an embodiment of an electronic device (branching filter) of the present invention.

FIG. 11 shows a plan view of the piezoelectric substrate 20 of Example 3 of the embodiment. Note that, the following explanation focuses on the differences of Example 3 from Example 1 and Example 2. Explanations on the same constitution as Example 1 and Example 2 may be omitted.

The piezoelectric substrate 20 of Example 3 is constituted by two piezoelectric substrates, specifically a transmission side piezoelectric substrate 20a and a reception side piezoelectric substrate 20b. Note that, the transmission piezoelectric substrate 20a and the reception side piezoelectric substrate 20b are formed to have the same shapes and same sizes as each other, for example. In other words, the transmission piezoelectric substrate 20a and the reception side piezoelectric substrate 20b are formed to have the shapes and sizes equivalent to those obtained by dividing one piezoelectric substrate 20 in Example 1 and Example 2 into two at the virtual line 50.

In Example 3, the antenna electrode is not shared by the transmission filter 26 and the reception filter 27. Namely, the transmission filter 26 has a transmission antenna electrode 23A, and the reception filter 27 has a reception antenna electrode 23B. The transmission antenna electrode 23A and reception antenna electrode 23B are arranged at positions line-symmetrical with respect to the virtual line 50.

Further, the piezoelectric substrate 20 of Example 3 does not have a ring-shaped electrode 33. However, as in the Example 1 and Example 2, a ring-shaped electrode 33 surrounding the outer periphery of the piezoelectric substrate 20 may be provided or a ring-shaped electrode surrounding the outer periphery of each substrate may be provided in each of the transmission side piezoelectric substrate 20a and the reception side piezoelectric substrate 20b.

Each of the transmission side piezoelectric substrate 20a and the reception side piezoelectric substrate 20b has reference potential electrodes (30A to 30C). Note that, the number of reference potential electrodes 30 may be appropriately set. FIG. 11 exemplifies a case where two reference potential electrodes 30A and 30B are provided on the transmission side piezoelectric substrate 20a, and one reference potential electrode 30C is provided on the reception side piezoelectric substrate 20b.

The piezoelectric substrate side electrode group constituted by the input electrode 22 and output electrodes 24 and 25 is arranged asymmetrically with respect to the virtual line 50 as in the Example 1 and Example 2.

Figure 12:
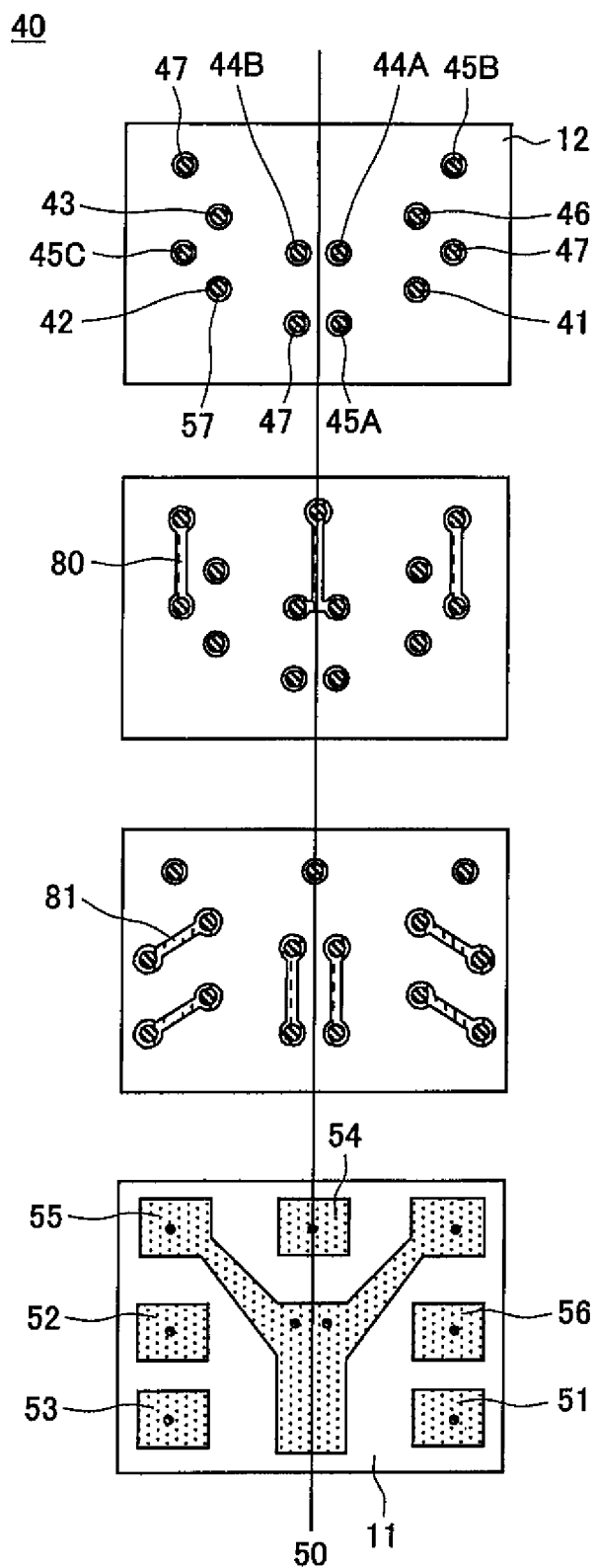
[FIG. 12] A plan view showing the arrangements of inner layer electrodes and vias of the mounting substrate in the branching filter of FIG. 11.

FIG. 12 is a plan view showing the arrangements of inner layer electrodes and vias of the mounting substrate 40 of Example 3.

The mounting substrate 40 has, on the piezoelectric substrate mounting surface 12, a first mounting substrate side electrode group connected to the transmission filter 26 and reception filter 27 of the piezoelectric substrate 20. The first mounting substrate side electrode group is arranged symmetrically with respect to the virtual line 50 in the same way as Example 1 and Example 2. The electrode pads arranged on the right in FIG. 12 are the electrode pads connected to the transmission filter 26, and the electrode pads arranged on the left in FIG. 12 are the electrode pads connected to the reception filter 27.

The first mounting substrate side electrode group includes the electrode pad 41 connected to the input electrode 22 of the transmission filter 26, the electrode pads 42 and 43 connected to the output electrodes 24 and 25 of the reception filter 27, the electrode pad 44A connected to the transmission antenna electrode 23A, the electrode pad 44B connected to the reception antenna electrode 23B, and electrode pads 45A to 45C connected to the reference potential electrodes 30A to 30C of the transmission filter 26 and the reception filter 27.

Further, the first mounting substrate side electrode group includes the dummy electrode pads 46 and 47 not connected to either the transmission filter 26 or the reception filter 27. The dummy electrode pad 46 is arranged at a position symmetrical to the electrode pad 43 with respect to the virtual line 50. Further, the dummy electrode pad 47 is arranged at a position symmetrical to the electrode pads 45A to 45C with respect to the virtual line 50.

The terminal surface 11 of the piezoelectric board 40 of Example 3 is configured with terminal electrodes 55 which are connected to the ground electrodes connected to each other on the terminal surface 11 of Example 1. However, the terminal surface 11 of Example 3 may also be the same as that of Example 1.

The electrode pads 44A and 44B of the piezoelectric substrate mounting surface 12 connected to the transmission antenna electrode 23A and the reception antenna electrode 23B are connected to each other in the next layer of the piezoelectric substrate mounting surface 12. Then, these are connected to the terminal electrode 54 of the terminal surface 11 connected to the antenna.

The mounting substrate 40 does not have a ring-shaped electrode pad 48 and does not have a matching circuit constituted by inner layer electrodes. The matching circuit is provided as, for example, external parts. However, in the same way as Example 1 and Example 2, a matching circuit constituted by a ring-shaped conductor 48 and inner layer electrodes may be provided as well.

According to Example 3 of the embodiment described above, the same effects as Example 1 are obtained. Namely, the mounting substrate 40 of Example 3 can mount not only the piezoelectric substrate 20 having the normal arrangement shown in FIG. 11, but also a piezoelectric substrate having a mirror arrangement. Both of the normal arrangement and the mirror arrangement are realized by one mounting substrate 40.

Note that, the transmission antenna electrode 23A and the reception antenna electrode 23B may also be arranged at positions asymmetrical with respect to the virtual line 50. Even in this case, when dummy electrode pads corresponding to the transmission antenna electrode 23A and the reception antenna electrode 23B are provided on the piezoelectric substrate mounting surface 12 of the mounting substrate 40, both of the mirror arrangement and the normal arrangement are realized by one mounting substrate 40.

<Example 4 of Embodiment>

Figure 13:
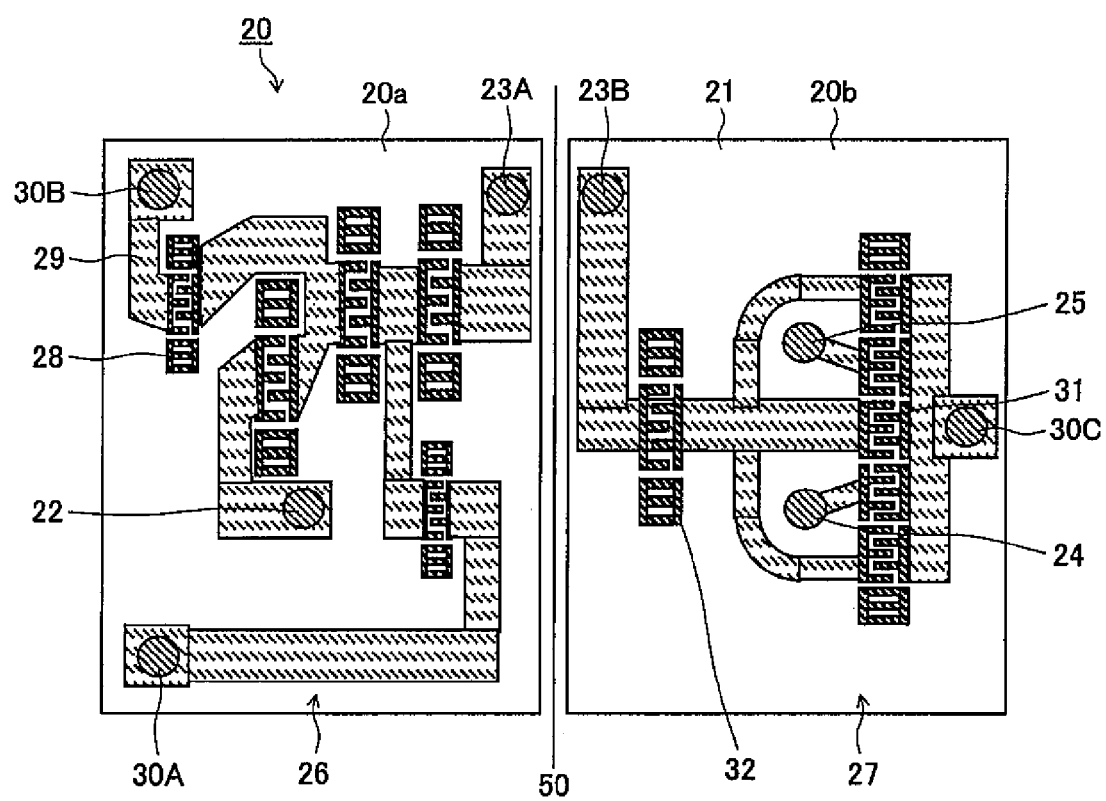
[FIG. 13] A plan view of a piezoelectric substrate showing Example 4 of an embodiment of an electronic device (branching filter) of the present invention.

FIG. 13 shows a plan view of the piezoelectric substrate 20 of Example 4 of the embodiment. Note that, the following description focuses on the differences of Example 4 from Example 1 to Example 3. Explanation on the same constitution as Example 1 to Example 3 may be omitted.

The piezoelectric substrate 20 of Example 4 has substantially the same constitution as that of the piezoelectric substrate 20 of Example 3. However, the transmission antenna electrode 23A and the reception antenna electrode 23B are arranged at an edge side of the piezoelectric substrate 20. Specifically, these are arranged on the edge side in a direction in which the virtual line 50 extends. As a result, in comparison with Example 3, the distances from the transmission antenna electrode 23A and the reception antenna electrode 23B to the input electrode 22 and output electrodes 24 and 25 arranged near the center of the transmission side piezoelectric substrate 20a and the reception side piezoelectric substrate 20b become larger. Further, the reference potential electrode 30A is arranged on the edge side away from the reference potential electrode 30B and the virtual line 50.

Figure 14:
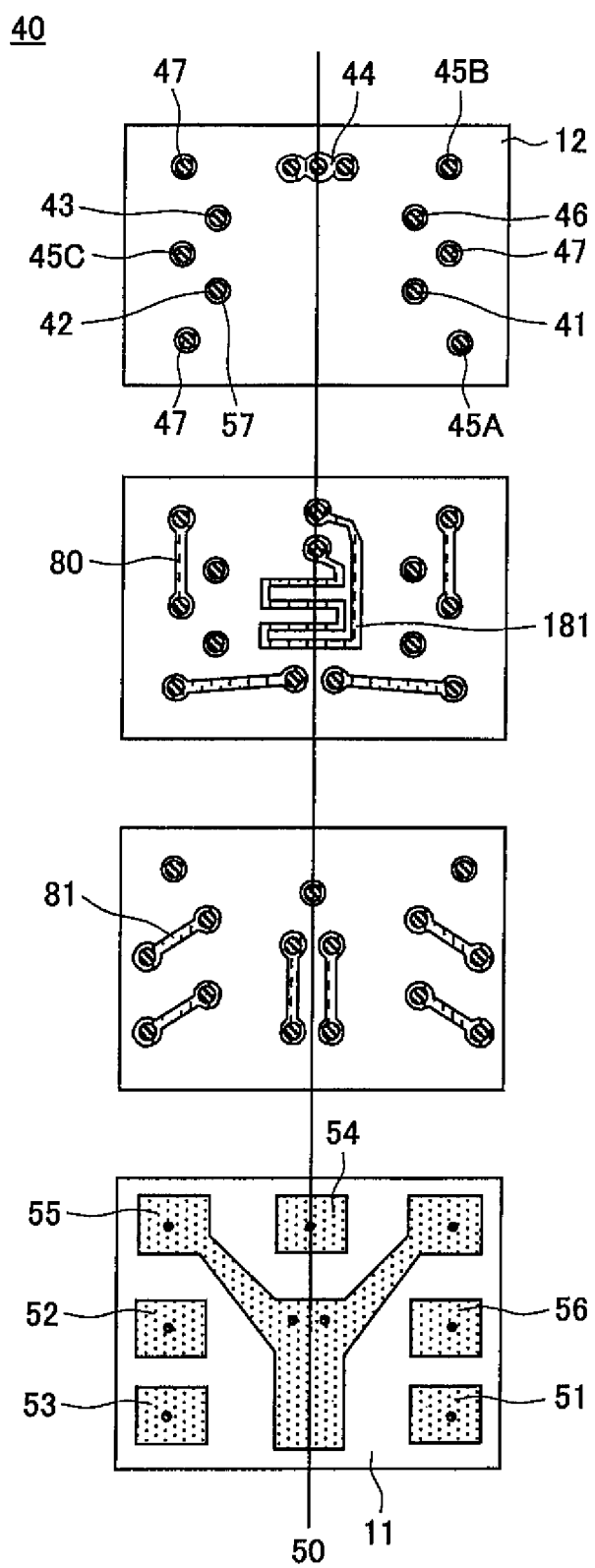
[FIG. 14] A plan view showing the arrangements of inner layer electrodes and vias of the mounting substrate in the branching filter of FIG. 13.

FIG. 14 is a plan view showing the arrangements of the inner layer electrodes and vias of the mounting substrate 40 of Example 4.

At the piezoelectric substrate mounting surface 12 of the mounting substrate 40 of Example 4, in comparison with the mounting substrate 40 of Example 3, along with the change of positions of the transmission antenna electrode 23A and reception antenna electrode 23B and reference potential electrode 30A of the piezoelectric substrate 20, the positions of the electrode pads 44 and 45A connected to these and the dummy electrode pad 47 line-symmetrical with the electrode pad 45A among the plurality of dummy electrode pads 47 are changed.

Further, in Example 4, one electrode pad 44 contacts both of the transmission antenna electrode 23A and the reception antenna electrode 23B. The electrode pad 44 has a line-symmetrical shape with respect to the virtual line 50.

The mounting substrate 40 of Example 4 has a matching circuit 181 constituted by inner layer electrodes 80. The matching circuit 181 is for example a meander type matching circuit.

According to Example 3 of the embodiment described above, the same effects as Example 1 are obtained. Namely, the mounting substrate 40 of Example 4 can mount not only the piezoelectric substrate 20 with the normal arrangement shown in FIG. 13, but also the piezoelectric substrate with the mirror arrangement. Both of the normal arrangement and the mirror arrangement are realized by one mounting substrate 40. Further, the distances from the transmission antenna electrode 23A and reception antenna electrode 23B to the input electrode 22 and output electrodes 24 and 25 become larger, therefore improvement of isolation is expected.

<Example 5 of Embodiment>

Figure 15:
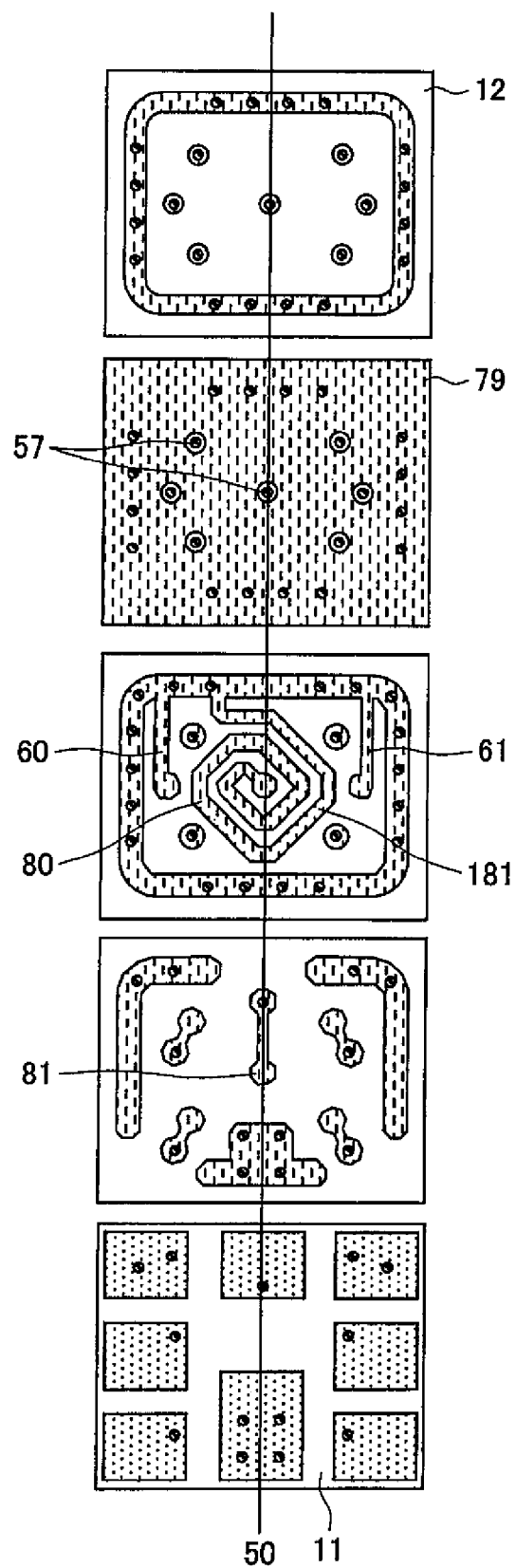
[FIG. 15] A plan view showing the arrangements of inner layer electrodes and vias of the mounting substrate showing Example 5 of an embodiment of an electronic device (branching filter) of the present invention.

FIG. 15 is a plan view showing the arrangements of the inner layer electrodes and vias of the mounting substrate 40 of Example 5 of the embodiment.

The mounting substrate 40 of Example 5 is configured in which, in the mounting substrate 40 of Example 1 shown in FIG. 6, a ground layer 79 covering the matching circuit 181 is provided between the piezoelectric substrate mounting surface 12 and the inner layer electrodes 80 constituting the matching circuit 181. The ground layer 79 spreads over, for example, the entire cross-section parallel to the piezoelectric substrate mounting surface 12 of the mounting substrate 40 and has a shape with holes formed only around the vias 57 for transferring the input electrode signals. The ground layer 79 is connected to the reference potential through the vias 57 connected to the electrode 55.

In the mounting substrate 40, comparing the time when mounting a piezoelectric substrate of a normal arrangement with the time when mounting a piezoelectric substrate of a mirror arrangement, the positions of the various types of signals are inverted with respect to the virtual line 50. As a result, the mode of interference between the signal and the matching circuit 181 changes, so the characteristics of the branching filter may change. However, in the mounting substrate 40 of Example 5, electrical interference between the piezoelectric substrate mounting surface 12 and the matching circuit 181 is eased by the ground layer 79, so the characteristics of the branching filter are stabilized.

<Example 6 of Embodiment>

Figure 16:
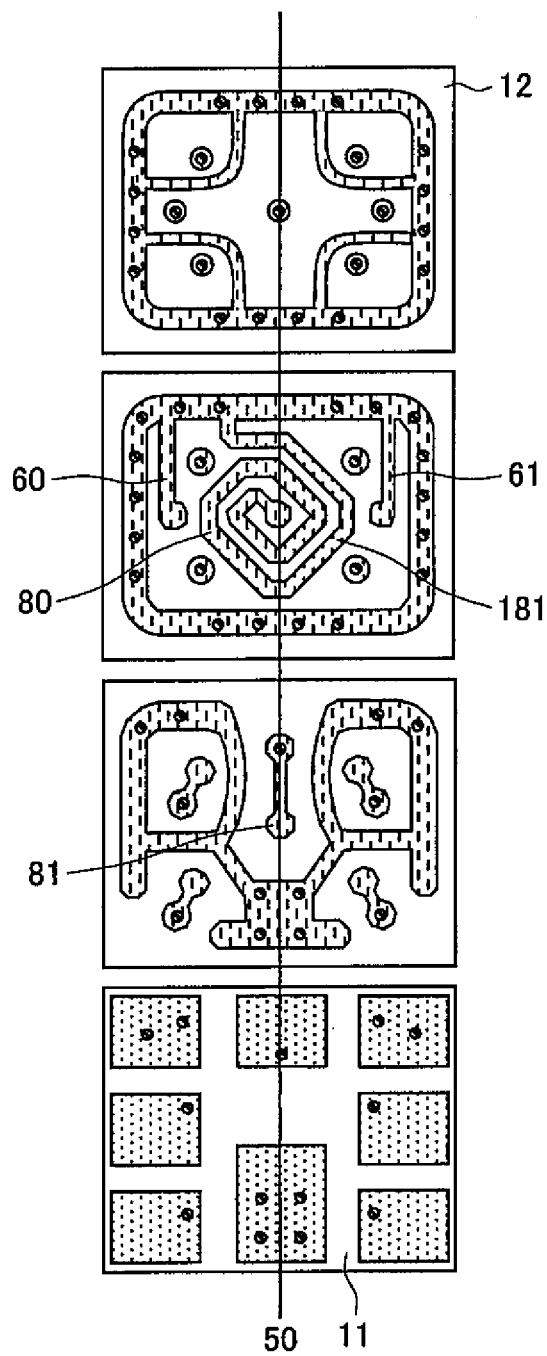
[FIG. 16] A plan view showing the arrangements of inner layer electrodes and vias of the mounting substrate showing Example 6 of an embodiment of an electronic device (branching filter) of the present invention.

FIG. 16 is a plan view showing the arrangements of the inner layer electrodes and vias of the mounting substrate 40 of Example 6 of the embodiment.

In the mounting substrate 40 of Example 6, the reference potential electrode is arranged between a plurality of signal-use electrodes on the piezoelectric substrate mounting surface 12. Further, the reference potential electrode is formed so as to completely surround each of the plurality of signal electrodes. Accordingly, the plurality of signal electrodes are separated from each other by the reference potential electrode.

Similarly, in the layer of the inner layer electrode 81, reference potential electrodes are arranged between vias and electrodes for transferring signals. Further, part of the plurality of signal electrodes is completely surrounded by the reference potential electrode.

According to the mounting substrate 40 of Example 6 described above, interference between signals is suppressed. As a result, not only is the SN ratio of the signals improved, but also the change of characteristics between the time of a normal arrangement and the time of a mirror arrangement is suppressed.

EXAMPLE 1

An example in which branching filters of the normal arrangement and the mirror arrangement shown in FIG. 7A, FIG. 9, and FIG. 7B are prepared is specifically explained.

First, lithium tantalate (LiTaO$_3$) was used for the piezoelectric substrate 20, a Ti thin film having a thickness of 6 nm was formed on its main surface, and a thin film of Al—Cu alloy having a thickness of 157 nm was formed on the Ti thin film.

Next, a photo-resist was applied to have a thickness of about 0.5 μm by a resist coating applicator. Then, by a reduced projection exposure apparatus (stepper), photo-resist patterns for forming the resonators, interconnects, input/output electrodes, etc. shown in FIG. 7A were formed. Further, unnecessary parts of the photo-resist layer were dissolved by an alkali developer by a developing apparatus.

Next, an RIE (Reactive Ion Etching) apparatus was used to form the electrode patterns shown in FIG. 7A. Then, a protective film was formed on predetermined regions of the electrode patterns. Namely, a CVD (Chemical Vapor Deposition) apparatus was used to form an SiO$_2$ layer of about 15 nm thick on the electrode patterns and the main surface of the piezoelectric substrate 20. Then, photolithography was used to pattern the photo-resist and an RIE apparatus or the like was used to etch the SiO$_2$ film of the flip-chip use electrode portion (input/output electrodes 22, 24, and 25, antenna electrode 23, and reference potential electrode and ring-shaped electrode 33).

Next, a sputtering apparatus was used to stack a Cr layer, Ni layer, and Au layer at the parts where the SiO$_2$ film was removed so as to form a laminated electrode. The electrode film thicknesses at this time were set to 0.01 μm, 1 μm, and 0.2 μm.

Further, the photo-resist and the laminate electrodes in the unnecessary portion were simultaneously removed by a lift-off method. The part where the laminate electrodes were formed was used as a flip-chip electrode portion for connecting flip-chip bumps.

Next, in order to investigate if the preceding steps meet predetermined screening standards, the electrical characteristics were inspected. For the inspection of the electrical characteristics, a probe card having probes provided at predetermined positions was used and the characteristics were measured by a network analyzer.

Next, the piezoelectric substrate 20 was diced along dicing lines and divided into pieces in each of which a set of a transmission filter 26 and a reception filter 27 was formed.

Next, a conductive connecting material was printed on an electrode group made of silver on the mounting substrate 40 having a laminate structure made of a ceramic. Solder was used as the conductive connecting material. Then, the electrode formation surface as a bottom surface of the piezoelectric substrate 20 of each piece was temporarily bonded onto the mounting substrate 40 by a flip-chip mounting apparatus.

At this time, in the branching filter with the normal arrangement, the piezoelectric substrate 20 was oriented as shown in FIG. 7A and the mounting substrate 40 was oriented as shown in FIG. 8. In the branching filter with the mirror arrangement, the piezoelectric substrate 20 was oriented as shown in FIG. 7B and the mounting substrate 40 was oriented as shown in FIG. 8. The temporary bonding was carried out in an N$_2$ gas atmosphere.

Further, by performing baking in an N$_2$ gas atmosphere to melt the solder, the plurality of pieces of piezoelectric substrate 20 were bonded to the mounting substrate 40. An inductor for impedance matching was formed by a channel provided inside the mounting substrate 40.

Next, the mounting substrate 40 to which the plurality of pieces of the piezoelectric substrate 20 were bonded was coated with resin and baked in an N$_2$ gas atmosphere to seal the piezoelectric substrate 20 by a resin.

Next, the mounting substrate 40 was diced along the dicing lines and divided into pieces to prepare the branching filters of the present invention. Note that, the divided pieces of the branching filters had lengths, widths, and thicknesses of 2.5 mm×2.0 mm×0.8 mm.

According to the above, it became possible to produce both branching filters of the normal arrangement and the mirror arrangement without the necessity of work such as changing probe cards or re-connecting interconnects at the time of inspection, and in addition, by using the same piezoelectric substrate and mounting substrate.

Note that, the present invention is not limited to the above embodiments and examples and may be modified in various ways so long as they are within the scope of the appended claims of the present invention.

For example, in the above embodiments and examples, examples using DMS filters for the reception filters were explained. However, ladder type filters or lattice type filters may be used as well. Further, the matching circuit need not necessarily be built-in. In that case, electromagnetic interference between the matching circuit and the interconnects on the piezoelectric substrate becomes smaller, therefore it becomes easy to realize substantially the same electrical characteristics in the normal arrangement and the mirror arrangement.

Further, in the embodiments described above, branching filters were shown as an example of electronic devices, but the present invention can be applied to electronic devices other than branching filters as well. Electronic devices other than a branching filter include, for example, a filter mounted on a multiband mobile phone having two communication systems. Such a filter has two different pass band frequencies. Specifically, piezoelectric substrates 20 on which two surface acoustic wave filters having different center frequencies are formed are mounted on one mounting substrate 40. In such a filter as well, by applying the present invention, a mounting substrate 40 on which both of a piezoelectric substrate 20 for a normal arrangement and a piezoelectric substrate 20 for a mirror arrangement can be mounted can be realized, so a reduction of the costs of the filter can be achieved.

The invention claimed is:

1. An electronic device, comprising:
   a piezoelectric substrate; and
   a mounting substrate on which the piezoelectric substrate is mounted, wherein
   the piezoelectric substrate comprises, on a main surface which is a surface mounted on the mounting substrate, a piezoelectric substrate side electrode group comprising a first electrode, a second electrode, and a third electrode, the mounting substrate comprises,
- on a first main surface facing the main surface of the piezoelectric substrate, a first mounting substrate side electrode group comprising,
  - a plurality of electrode pads connected to the first electrode, the second electrode, and the third electrode, respectively, and
  - a dummy electrode pad connected to none of the first electrode, the second electrode, and the third electrode; and,
- on a second main surface which is on the back of the first main surface, a second mounting substrate side electrode group comprising a plurality of terminal electrodes electrically connected to the first mounting substrate side electrode group and connected to circuit interconnects of an external circuit board, the first mounting substrate side electrode group and the second mounting substrate side electrode group are each arranged line-symmetrically with respect to a virtual line on the first main surface in a plan view, and the piezoelectric substrate side electrode group is arranged asymmetrically with respect to the virtual line.

2. The electronic device according to claim 1, wherein
a transmitting filter comprising the first electrode and a receiving filter comprising the second electrode are formed in the piezoelectric substrate, and the first electrode is an input electrode of the transmitting filter, the second electrode is an output electrode of the receiving filter, and the third electrode is an antenna electrode common to the transmitting filter and the receiving filter.

3. The electronic device according to, claim 2, wherein the third electrode is located on the virtual line.

4. The electronic device according to claim 2, wherein
one terminal electrode of the second mounting substrate side electrode group electrically connected to the third electrode is located on the virtual line, and in the second mounting substrate side electrode group, another terminal electrode electrically connected to the first electrode and the other terminal electrode electrically connected to the second electrode are arranged line-symmetrically with respect to the virtual line.

5. The electronic device according to claim 1, wherein the second mounting substrate side electrode group comprises a dummy terminal electrode electrically separated from the circuit interconnects of the external circuit board.

6. The electronic device according to claim 2, wherein the mounting substrate further comprises a matching circuit for matching impedance of the transmitting filter with impedance of the receiving filter therein.

7. The electronic device according to claim 6, wherein the mounting substrate further comprises a ground layer, which covers the matching circuit, between the first main surface and the matching circuit.

8. The electronic device according to claim 2, wherein the transmitting filter is an unbalanced signal input type, and the receiving filter is a balanced signal output type.

9. The electronic device according to claim 8, wherein the receiving filter is a longitudinally coupled multimode filter.

10. The electronic device according to claim 2, wherein
the piezoelectric substrate side electrode group further comprises an annular electrode surrounding the transmitting filter and the receiving filter on the main surface of the piezoelectric substrate, and the first mounting substrate side electrode group comprises an annular electrode pad connected to the annular electrode.

11. The electronic device according to claim 10, wherein the second mounting substrate side electrode group comprises one terminal electrode for a reference potential, and the annular electrode is electrically connected to the one terminal, electrode.

12. The electronic device according to claim 2, wherein, in the first mounting substrate side electrode group, one electrode pad connected to the first electrode and another electrode pad connected to the second electrode are each arranged line-symmetrically with respect to the virtual line.

13. The electronic device according to claim 2, wherein
the piezoelectric substrate side electrode group further comprises a reference potential electrode, and the first mounting substrate side electrode group comprises a electrode pad connected to the reference potential electrode, and the electrode pad of the first mounting substrate side electrode group connected to the reference potential electrode and the dummy electrode pad are arranged line-symmetrically with respect to the virtual line.

14. An electronic device, comprising:
a piezoelectric substrate; and
a mounting substrate on which the piezoelectric substrate is mounted, wherein the piezoelectric substrate comprises, on a main surface which is a surface mounted on the mounting substrate, a piezoelectric substrate side electrode group comprising a first electrode, a second electrode, and a third electrode, the mounting substrate comprises,
- on a first main surface facing the main surface of the piezoelectric substrate, a first mounting substrate side electrode group comprising,
  - a plurality of electrode pads connected to the first electrode, the second electrode, and the third electrode, respectively, and
  - a dummy electrode pad not connected to any of the first electrode, the second electrode, and the third electrode; and,
- on a second main surface which is on the back of the first main surface, a second mounting substrate side electrode group including a plurality of terminal electrodes electrically connected to the first mounting substrate side electrode group and connected to circuit interconnects of an external circuit board, the first mounting substrate side electrode group is arranged rotationally symmetrically 180° with respect to a center of symmetry on the first main surface in a plan view, the second mounting substrate side electrode group is arranged line-symmetrically with respect to a virtual line passing through the center of symmetry in a plan view, and the piezoelectric substrate side electrode group is arranged rotationally symmetrically 180° with respect to the center of symmetry in a plan view.

15. The electronic device according to claim 14, wherein
a transmitting filter comprising the first electrode and a receiving filter comprising the second electrode are formed in the piezoelectric substrate, and the first electrode is an input electrode of the transmitting filter, the second electrode is an output electrode of the receiving filter, and the third electrode is a common antenna electrode of the transmitting filter and the receiving filter.

16. The electronic device according to claim 15, wherein the third electrode is located on the axis of symmetry.

17. The electronic device according to claim 14, wherein
one terminal electrode of the second mounting substrate side electrode group electrically connected to the third electrode is located on the axis of symmetry, and in the second mounting substrate side electrode group, another terminal electrode electrically connected to the first electrode and the other terminal electrode electrically connected to the second electrode are arranged line-symmetrically with respect to the axis of symmetry.

18. The electronic device according to claim 14, wherein the second mounting substrate side electrode group comprises a dummy terminal electrode electrically separated from the circuit interconnects of the external circuit board.

19. The electronic device according to claim 15, wherein the mounting substrate further comprises a matching circuit matching impedance of the transmitting filter with impedance of the receiving filter therein.

20. The electronic device according to claim 19, wherein the mounting substrate further comprises a ground layer, which covers the matching circuit, between the first main surface and the matching circuit.

* * * * *